United States Patent
König et al.

(10) Patent No.: US 10,056,508 B2
(45) Date of Patent: Aug. 21, 2018

(54) ELECTRO-CONDUCTIVE PASTES COMPRISING A METAL COMPOUND

(71) Applicant: Heraeus Deutschland GmbH & Co. KG, Hanau (DE)

(72) Inventors: Markus König, Dieburg (DE); Gerd Schulz, Conshohocken, PA (US); Daniel Winfried Holzmann, Blue Bell, PA (US); Matthias Hörteis, Bryn Mawr, PA (US); Nicole Georg, Blue Bell, PA (US); Christin Behl, Mömbris (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 0 days.

(21) Appl. No.: 15/080,190

(22) Filed: Mar. 24, 2016

(65) Prior Publication Data
US 2016/0284900 A1     Sep. 29, 2016

Related U.S. Application Data

(60) Provisional application No. 62/139,284, filed on Mar. 27, 2015.

(51) Int. Cl.
*H01B 1/22* (2006.01)
*H01L 31/0224* (2006.01)
(Continued)

(52) U.S. Cl.
CPC ........ *H01L 31/022466* (2013.01); *C03C 8/18* (2013.01); *H01B 1/22* (2013.01);
(Continued)

(58) Field of Classification Search
CPC ..... C03C 8/18; H01B 1/22; H01L 31/022425; H01L 31/022466; H01L 31/068; H01L 31/1864; H01L 31/1884; Y02E 10/546
See application file for complete search history.

(56) References Cited

U.S. PATENT DOCUMENTS

| | | |
|---|---|---|
| 4,863,757 A | 9/1989 | Durand |
| 5,296,413 A | 3/1994 | Carroll et al. |

(Continued)

FOREIGN PATENT DOCUMENTS

| | | |
|---|---|---|
| CN | 102290118 A | 12/2011 |
| CN | 102354544 A | 2/2012 |

(Continued)

OTHER PUBLICATIONS

"Vanadium(III) acetylacetonate", Sigma-Aldrich online catalog, http://www.sigmaaldrich.com/catalog/product/aldrich/227110?lang=en&region=US&gclid=EAlaIQobChMIx8mYkc6T1Q1VxoWzCh3YFAsIEAAYASAA-EglHePD_BwE.*

*Primary Examiner* — Mark Kopec
*Assistant Examiner* — Jaison P Thomas
(74) *Attorney, Agent, or Firm* — Blank Rome LLP

(57) ABSTRACT

In general, the present invention relates to an electro-conductive paste comprising a metal additive and solar cells obtainable therefrom by application of the paste to a p-type doped face. More specifically, the present invention relates to electro-conductive pastes, solar cell precursors, processes for preparation of solar cells, solar cells and solar modules. The present invention relates to a precursor comprising the following paste constituents:
  a. A Si wafer with at least one p-type doped face and at least one n-type doped face;
  b. A conductive paste comprising the following paste constituents:
     i. at least about 70 wt. % Ag particles, based on the paste,
     ii. a vehicle,
     iii. a glass,
     iv. a metal compound comprising a metal M and which is one or more selected from the group consisting of:
(Continued)

an organic metal oxide, a metal oxide, an organic metal compound and a silver metal oxide;
wherein the conductive paste b. is superimposed on a p-type doped face.

17 Claims, 4 Drawing Sheets

(51) Int. Cl.
*H01L 31/068* (2012.01)
*H01L 31/18* (2006.01)
*C03C 8/18* (2006.01)

(52) U.S. Cl.
CPC .... *H01L 31/022425* (2013.01); *H01L 31/068* (2013.01); *H01L 31/1864* (2013.01); *H01L 31/1884* (2013.01); *Y02E 10/546* (2013.01)

(56) References Cited

U.S. PATENT DOCUMENTS

| | | | |
|---|---|---|---|
| 5,302,557 A | 4/1994 | Carroll et al. | |
| 6,071,437 A * | 6/2000 | Oya | H01B 1/16 136/243 |
| 6,517,931 B1 | 2/2003 | Fu | |
| 7,485,245 B1 | 2/2009 | Konno | |
| 2004/0245507 A1 | 12/2004 | Nagai et al. | |
| 2005/0256241 A1 | 11/2005 | Sachdev et al. | |
| 2006/0231800 A1 | 10/2006 | Wang et al. | |
| 2006/0289055 A1 | 12/2006 | Sridharan et al. | |
| 2007/0024193 A1 | 2/2007 | Kim | |
| 2007/0235694 A1 | 10/2007 | Nair et al. | |
| 2008/0203914 A1 | 8/2008 | Cho et al. | |
| 2008/0254567 A1 | 10/2008 | Konno | |
| 2008/0314444 A1 | 12/2008 | Kawaguchi | |
| 2009/0101872 A1 | 4/2009 | Young et al. | |
| 2009/0107544 A1 * | 4/2009 | Carroll | C03C 8/14 136/252 |
| 2009/0211626 A1 | 8/2009 | Akimoto | |
| 2009/0250106 A1 | 10/2009 | Hayashi et al. | |
| 2009/0266409 A1 | 10/2009 | Wang et al. | |
| 2009/0298283 A1 | 12/2009 | Akimoto et al. | |
| 2010/0126565 A1 | 5/2010 | Takeda et al. | |
| 2010/0258165 A1 | 10/2010 | Carroll et al. | |
| 2010/0258166 A1 | 10/2010 | Laughlin et al. | |
| 2010/0258184 A1 | 10/2010 | Laughlin et al. | |
| 2010/0294353 A1 | 11/2010 | Takahashi | |
| 2010/0301479 A1 | 12/2010 | Yang et al. | |
| 2011/0048527 A1 * | 3/2011 | Irizarry | B22F 1/0059 136/256 |
| 2011/0088769 A1 * | 4/2011 | Hang | H01B 1/22 136/256 |
| 2011/0126897 A1 | 6/2011 | Gao et al. | |
| 2011/0155240 A1 | 6/2011 | Wang et al. | |
| 2011/0186121 A1 * | 8/2011 | Horteis | H01B 1/22 136/256 |
| 2011/0203659 A1 | 8/2011 | Carroll et al. | |
| 2011/0233481 A1 | 9/2011 | Alvarez | |
| 2011/0315218 A1 | 12/2011 | Carroll | |
| 2012/0062670 A1 | 3/2012 | Gao | |
| 2013/0099178 A1 | 4/2013 | Hang et al. | |
| 2013/0104973 A1 | 5/2013 | Jee et al. | |
| 2013/0160830 A1 | 6/2013 | Ionkin | |
| 2013/0187101 A1 | 7/2013 | Rajendran | |
| 2015/0072463 A1 * | 3/2015 | Yang | H01L 31/02242 438/72 |

FOREIGN PATENT DOCUMENTS

| | | |
|---|---|---|
| CN | 102368391 A | 3/2012 |
| CN | 102543260 A | 7/2012 |
| EP | 0895252 A1 | 2/1999 |
| EP | 1713091 A2 | 10/2006 |
| EP | 1713092 A2 | 10/2006 |
| EP | 1713095 A2 | 10/2006 |
| EP | 1749600 A1 | 2/2007 |
| EP | 1835512 A1 | 9/2007 |
| EP | 2402967 A2 | 1/2012 |
| EP | 2444979 A1 | 4/2012 |
| EP | 2571049 A1 | 3/2013 |
| EP | 2586752 A1 | 5/2013 |
| EP | 2592629 A1 | 5/2013 |
| EP | 2853567 A1 | 4/2015 |
| JP | H-01258303 A | 10/1989 |
| JP | H-01258304 A | 10/1989 |
| JP | H06240183 A | 8/1994 |
| JP | 2931450 B2 | 8/1999 |
| JP | 2000138385 A | 5/2000 |
| JP | 2001117220 A | 4/2001 |
| JP | 2001143527 A | 5/2001 |
| JP | 2001240901 A | 9/2001 |
| JP | 3346023 B2 | 11/2002 |
| JP | 2004063445 A | 2/2004 |
| JP | 2004206883 A | 7/2004 |
| JP | 2007294731 A | 11/2007 |
| JP | 2008135190 A | 6/2008 |
| JP | 2010202910 A | 9/2010 |
| KR | 20120077439 A | 7/2012 |
| WO | WO-2007149883 A1 | 12/2007 |
| WO | WO-2012058358 A1 | 5/2012 |
| WO | WO-2012099877 A1 | 7/2012 |
| WO | WO-2012135551 A1 | 10/2012 |
| WO | WO-2013036510 A1 | 3/2013 |
| WO | WO-2013096715 A1 | 6/2013 |
| WO | WO 2013/158864 * 10/2013 ............... H01B 1/22 |

* cited by examiner

ELECTRO-CONDUCTIVE PASTES COMPRISING A METAL COMPOUND

This application claims the benefit of U.S. Provisional Application No. 62/139,284, filed Mar. 27, 2015, which is hereby incorporated by reference in its entirety.

FIELD OF THE INVENTION

In general, the present invention relates to electro-conductive pastes comprising metals compounds and solar cells obtainable therefrom, preferably photovoltaic solar cells. More specifically, the present invention relates to electro-conductive pastes, solar cell precursors, processes for preparation of solar cells, solar cells and solar modules.

BACKGROUND OF THE INVENTION

Solar cells are devices that convert the energy of light into electricity using the photovoltaic effect. Solar power is an attractive green energy source because it is sustainable and produces only non-polluting by-products. Accordingly, a great deal of research is currently being devoted to developing solar cells with enhanced efficiency while continuously lowering material and manufacturing costs. When light hits a solar cell, a fraction of the incident light is reflected by the surface and the remainder transmitted into the solar cell. The transmitted photons are absorbed by the solar cell, which is usually made of a semiconducting material, such as silicon which is often doped appropriately. The absorbed photon energy excites electrons of the semiconducting material, generating electron-hole pairs. These electron-hole pairs are then separated by p-n junctions and collected by conductive electrodes on the solar cell surfaces. FIG. 1 shows a minimal construction for a simple solar cell.

Solar cells are very commonly based on silicon, often in the form of a Si wafer. Here, a p-n junction is commonly prepared either by providing an n-type doped Si substrate and applying a p-type doped layer to one face or by providing a p-type doped Si substrate and applying an n-type doped layer to one face to give in both cases a so called p-n junction. The face with the applied layer of dopant generally acts as the front face of the cell, the opposite side of the Si with the original dopant acting as the back face. Both n-type and p-type solar cells are possible and have been exploited industrially. Cells designed to harness light incident on both faces are also possible, but their use has been less extensively harnessed.

In order to allow incident light on the front face of the solar cell to enter and be absorbed, the front electrode is commonly arranged in two sets of perpendicular lines known as "fingers" and "bus bars" respectively. The fingers form an electrical contact with the front face and bus bars link these fingers to allow charge to be drawn off effectively to the external circuit. It is common for this arrangement of fingers and bus bars to be applied in the form of an electro-conductive paste which is fired to give solid electrode bodies. A back electrode is also often applied in the form of an electro-conductive paste which is then fired to give a solid electrode body. A typical electro-conductive paste contains metallic particles, glass frit, and an organic vehicle.

Organic transition metal compounds have previously been employed in photovoltaic pastes, for example in WO 2012/0583058 A1.

There continues to be a need in the state of the art for improvements to the approach to producing photovoltaic solar cells.

SUMMARY OF THE INVENTION

The present invention is generally based on the object of overcoming at least one of the problems encountered in the state of the art in relation to solar cells, in particular in relation to n-type solar cells and/or interdigitated backside contact cells.

More specifically, the present invention is further based on the object of providing solar cells with improved performance, in particular improved electrical performance.

A contribution to achieving at least one of the above described objects is made by the subject matter of the category forming claims of the present invention. A further contribution is made by the subject matter of the dependent claims of the present invention which represent specific embodiments of the present invention.

A further object of the invention is to improve the properties of a cell having a p-type doped front face. Another object of the invention is to reduce the number of pastes necessary for provided electrodes on an inter-digitated type cell.

DETAILED DESCRIPTION

A contribution to achieving at least one of the above described objects is made by the following embodiments.

|1| A precursor comprising the following paste constituents:
  a. A Si wafer with at least one p-type doped face and at least one n-type doped face;
  b. A conductive paste comprising the following paste constituents:
    i. at least about 70 wt. %, preferably at least about 75 wt. %, more preferably at least about 80 wt. %, Ag particles, based on the paste,
    ii. a vehicle,
    iii. a glass,
    iv. a metal compound comprising a metal M and which is one or more selected from the group consisting of: an organic metal oxide, a metal oxide, an organic metal compound and a silver metal oxide;
  wherein the conductive paste b. is superimposed on a p-type doped face.

|2| The conductive paste composition according to embodiment 1, wherein the metal M of the metal compound is one or more selected from the group consisting of: Ge, Pb, As, Se, Sb, Bi, Te, Nb, Ta, Cr, Mo, W and V, preferably one or more selected from the group consisting of: Mo, W, Cr, Nb, Te, and V; more preferably one or more selected from the group consisting of Mo, W and V.

|3| The conductive paste composition according to embodiment |1| or |2|, wherein the metal compound comprises a chelating organic ligand.

|4| The conductive paste composition according to embodiment |3|, wherein the metal compound comprises one or more acac ligands.

|5| The precursor according to any of the preceding embodiments, wherein iv. is an organic metal oxide.

|6| The precursor according to any of the preceding embodiments, wherein the metal compound has the general formula $M_xO_yL_z$, wherein M is a metal;

L is a chelating ligand, and wherein the L may be the same as or different to each other;

x an integer in the range from about 1 to about 4, preferably 1 to 3, more preferably 1 or 2;

y is an integer in the range from about 1 to about 8;

z is an integer in the range from about 1 to about 20.

|7| The precursor according any of the preceding embodiments, wherein the metal compound is one or more selected from the group consisting of: $VO(acac)_2$, $V(acac)_3$, $MoO_2(acac)_2$, $WO_2(acac)_2$, and $Mo_2O_3(acac)_4$.

|8| The precursor according to any of the preceding embodiments, wherein at least 50 vol. % of the wafer is n-type doped.

|9| The precursor according to any of the preceding embodiments, wherein at least one of the following criteria are satisfied:
  a. The viscosity of the paste is in the range from about 5 to about 35 Pa*s;
  b. All solvents present in the paste have a boiling point in a range from about 90 to about 300° C.

|10| The precursor according to any of the preceding embodiments, wherein the silver particles of the paste
  i. have a value of $d_{50}$ for diameter distribution in the range from about 0.1 to about 5 μm.

|11| The conductive paste composition according to any of the preceding embodiments, wherein the silver particles i. are spherical.

|12| A process for producing a solar cell comprising the following steps:
  a. providing a precursor according to any of the embodiments |1| to |11|;
  b. firing the precursor in order to obtain the solar cell.

|13| The process according to embodiment |12|, wherein the firing in step b. satisfies at least one of the following criteria:
  a. holding temperature in a range from about 700 to about 900° C.;
  b. time at the holding temperature in a range from about 1 to about 10 s.

|14| The process according to embodiment |12| or |13|, wherein the paste is applied to the wafer through a screen.

|15| The process according to embodiment |14|, wherein the application through a screen satisfies at least one of the following parameters:
  a. mesh count in a range from about 270 to about 500/inch, preferably in the range from about 280 to about 420/inch, more preferably in the range from about 300 to about 400/inch;
  b. wire thickness in a range from about 10 to about 30 μm, preferably in the range from about 11 to about 20 μm, more preferably in the range from about 12 to about 16 μm;
  c. Emulsion over mesh (EoM) thickness in a range from about 5 to about 25 μm, preferably in the range from about 10 to about 25 μm, more preferably in the range from about 12 to about 17 μm;
  d. finger spacing in a range from about 1 to about 3 mm, preferably in the range from about 1.2 to about 1.8 mm, more preferably in the range from about 1.5 to about 2.5 mm.

|16| A solar cell obtainable from a process according to any of the embodiments |11| to |15|.

|17| A module comprising at least 2 solar cells, at least one of which is according to embodiment |16|.

Wafer

Preferred wafers according to the present invention are regions among other regions of the solar cell capable of absorbing light with high efficiency to yield electron-hole pairs and separating holes and electrons across a boundary with high efficiency, preferably across a so called p-n junction boundary. Preferred wafers according to the present invention are those comprising a single body made up of a front doped layer and a back doped layer.

It is preferred for that wafer to consist of appropriately doped tetravalent elements, binary compounds, tertiary compounds or alloys. Preferred tetravalent elements in this context are Si, Ge or Sn, preferably Si. Preferred binary compounds are combinations of two or more tetravalent elements, binary compounds of a group III element with a group V element, binary compounds of a group II element with a group VI element or binary compounds of a group IV element with a group VI element. Preferred combinations of tetravalent elements are combinations of two or more elements selected from Si, Ge, Sn or C, preferably SiC. The preferred binary compounds of a group III element with a group V element is GaAs. It is most preferred according to the present invention for the wafer to be based on Si. Si, as the most preferred material for the wafer, is referred to explicitly throughout the rest of this application. Sections of the following text in which Si is explicitly mentioned also apply for the other wafer compositions described above.

Where the front doped layer and back doped layer of the wafer meet is the p-n junction boundary. In an n-type solar cell, the back doped layer is doped with electron donating n-type dopant and the front doped layer is doped with electron accepting or hole donating p-type dopant. In a p-type solar cell, the back doped layer is doped with p-type dopant and the front doped layer is doped with n-type dopant. It is preferred according to the present invention to prepare a wafer with a p-n junction boundary by first providing a doped Si substrate and then applying a doped layer of the opposite type to one face of that substrate.

In one embodiment, the wafer comprises an n-type face and a p-type face which are both present on the same side of the wafer. One example of such an arrangement could be in an interdigitated wafer design, where provision of n-type and p-type faces on the same side of the wafer allows low shadowing of the sun-side face of the cell and/or a more convenient preparation.

In one embodiment, the wafer comprises an n-type face and a p-type face on opposing sides of the wafer.

Doped Si substrates are well known to the person skilled in the art. The doped Si substrate can be prepared in any way known to the person skilled in the art and which he considers to be suitable in the context of the present invention. Preferred sources of Si substrates according to the present invention are mono-crystalline Si, multi-crystalline Si, amorphous Si and upgraded metallurgical Si, mono-crystalline Si or multi-crystalline Si being most preferred. Doping to form the doped Si substrate can be carried out simultaneously by adding dopant during the preparation of the Si substrate or can be carried out in a subsequent step. Doping subsequent to the preparation of the Si substrate can be carried out for example by gas diffusion epitaxy. Doped Si substrates are also readily commercially available. According to the present invention it is one option for the initial doping of the Si substrate to be carried out simultaneously to its formation by adding dopant to the Si mix. According to the present invention it is one option for the application of the front doped layer and the highly doped back layer, if present, to be carried out by gas-phase epitaxy. This gas phase epitaxy is preferably carried out at a temperature in a range from 500° C. to 900° C., more preferably in a range from 600° C. to 800° C. and most preferably in a range from 650° C. to 750° C. at a pressure in a range from 2 kPa and 100 kPa, preferably in a range from 10 to 80 kPa, most preferably in a range from 30 to 70 kPa.

It is known to the person skilled in the art that Si substrates can exhibit a number of shapes, surface textures and sizes. The shape can be one of a number of different shapes including cuboid, disc, wafer and irregular polyhedron amongst others. The preferred shape according to the present invention is wafer shaped where that wafer is a cuboid with two dimensions which are similar, preferably equal and a third dimension which is significantly less than the other two dimensions. Significantly less in this context is preferably at least a factor of 100 smaller.

A variety of surface types are known to the person skilled in the art. According to the present invention Si substrates with rough surfaces are preferred. One way to assess the roughness of the substrate is to evaluate the surface roughness parameter for a sub-surface of the substrate which is small in comparison to the total surface area of the substrate, preferably less than one hundredth of the total surface area, and which is essentially planar. The value of the surface roughness parameter is given by the ratio of the area of the subsurface to the area of a theoretical surface formed by projecting that subsurface onto the flat plane best fitted to the subsurface by minimising mean square displacement. A higher value of the surface roughness parameter indicates a rougher, more irregular surface and a lower value of the surface roughness parameter indicates a smoother, more even surface. According to the present invention, the surface roughness of the Si substrate is preferably modified so as to produce an optimum balance between a number of factors including but not limited to light absorption and adhesion of fingers to the surface.

The two dimensions with larger scale of the Si substrate can be varied to suit the application required of the resultant solar cell. It is preferred according to the present invention for the thickness of the Si wafer to lie below 0.5 mm more preferably below 0.3 mm and most preferably below 0.2 mm. Some wafers have a minimum size of 0.01 mm or more.

It is preferred according to the present invention for the front doped layer to be thin in comparison to the back doped layer. It is preferred according to the present invention for the front doped layer to have a thickness lying in a range from 0.1 to 10 µm, preferably in a range from 0.1 to 5 µm and most preferably in a range from 0.1 to 2 µm.

A highly doped layer can be applied to the back face of the Si substrate between the back doped layer and any further layers. Such a highly doped layer is of the same doping type as the back doped layer and such a layer is commonly denoted with a + ($n^+$-type layers are applied to n-type back doped layers and $p^+$-type layers are applied to p-type back doped layers). This highly doped back layer serves to assist metallisation and improve electro-conductive properties at the substrate/electrode interface area. It is preferred according to the present invention for the highly doped back layer, if present, to have a thickness in a range from 1 to 100 µm, preferably in a range from 1 to 50 µm and most preferably in a range from 1 to 15 µm.

Dopants

Preferred dopants are those which, when added to the Si wafer, form a p-n junction boundary by introducing electrons or holes into the band structure. It is preferred according to the present invention that the identity and concentration of these dopants is specifically selected so as to tune the band structure profile of the p-n junction and set the light absorption and conductivity profiles as required. Preferred p-type dopants according to the present invention are those which add holes to the Si wafer band structure. They are well known to the person skilled in the art. All dopants known to the person skilled in the art and which he considers to be suitable in the context of the present invention can be employed as p-type dopant. Preferred p-type dopants according to the present invention are trivalent elements, particularly those of group 13 of the periodic table. Preferred group 13 elements of the periodic table in this context include but are not limited to B, Al, Ga, In, Tl or a combination of at least two thereof, wherein B is particularly preferred.

Preferred n-type dopants according to the present invention are those which add electrons to the Si wafer band structure. They are well known to the person skilled in the art. All dopants known to the person skilled in the art and which he considers to be suitable in the context of the present invention can be employed as n-type dopant. Preferred n-type dopants according to the present invention are elements of group 15 of the periodic table. Preferred group 15 elements of the periodic table in this context include N, P, As, Sb, Bi or a combination of at least two thereof, wherein P is particularly preferred.

Electro-Conductive Paste

Preferred electro-conductive pastes according to the invention are pastes which can be applied to a surface and which, on firing, form solid electrode bodies in electrical contact with that surface. The constituents of the paste and proportions thereof can be selected by the person skilled in the art in order that the paste have the desired properties such as sintering and printability and that the resulting electrode have the desired electrical and physical properties. Metallic particles can be present in the paste, primarily in order that the resulting electrode body be electrically conductive. In order to bring about appropriate sintering through surface layers and into the Si wafer, an inorganic reaction system can be employed. An example composition of an electrically-conductive paste which is preferred in the context of the invention might comprise:

i) Metallic particles, preferably silver particles, preferably at least about 50 wt. %, more preferably at least about 70 wt. % and most preferably at least about 80 wt. %;

ii) Inorganic reaction system, preferably glass frit or glass preferably in a range from about 0.1 to about 6 wt. %, more preferably in a range from about 0.5 to about 5 wt. % and most preferably in a range from about 1 to about 4 wt. %;

iii) Organic vehicle, preferably in a range from about 5 to about 40 wt. %, more preferably in a range from about 5 to about 30 wt. % and most preferably in a range from about 5 to about 15 wt. %;

iv) metal oxide or organic metal oxide, preferably in the range from about 0.01 to about 9 wt. % more preferably in the range from about 0.05 to about 5 wt. %, most preferably in the range from about 0.1 to about 4 wt. %.

In one embodiment of the solar cell precursor according to the present invention, the electro-conductive paste is on the front face of the wafer. In further embodiments, the electro conductive paste is on the back face of the wafer or even on both faces and/or in a hole penetrating the wafer. Such holes are often called via holes and are commonly used in so called metal wrap through designs which are described in WO 2012/026812 A1 and WO 2012/026806 A1.

Metal Compound

It is preferred in the context of the invention for the paste to comprise a metal compound. The metal compound preferably is either a silver metal oxide or is able to form a silver metal oxide under the firing conditions of the invention, preferably at temperatures below about 1000° C., more preferably below about 700° C., further more preferably at temperatures below about 600° C. In some cases this formation of the silver metal oxide is observed in a temperature range from about 350 to 550° C. The metal compound and amount thereof are preferably selected in such a way as to improve the properties of the resultant solar cell, preferably improving cell efficiency and/or open circuit voltage.

In one embodiment, the metal compound is an organic metal compound, preferably comprising a metal and one or more organic moieties having one or more carbon atoms, preferably one or more ligands as described below. In one aspect of this embodiment, the metal of the metal compound is one or more selected from the group consisting of Ge, Pb, As, Se, Sb, Bi, Te, Nb, Ta, Cr, Mo, W and V; preferably one or more selected from the group consisting of: Mo, W, Cr, Nb, Te, and V; more preferably one or more selected from the group consisting of Mo, W and V. In another aspect of this embodiment, the metal of the metal compound is not V, preferably being one or more selected from the group consisting of: Ge, Pb, As, Se, Sb, Bi, Te, Nb, Ta, Cr, Mo and W; preferably one or more selected from the group consisting of: Mo, W, Cr, Nb and Te; more preferably one or more selected from the group consisting of Mo and W.

In one embodiment, the metal compound is an organic metal oxide, preferably comprising a metal, oxygen and one or more organic moieties having one or more carbon atoms, preferably one or more ligands as described below. In one aspect of this embodiment, the metal of the metal compound is one or more selected from the group consisting of Ge, Pb, As, Se, Sb, Bi, Te, Nb, Ta, Cr, Mo, W and V; preferably one or more selected from the group consisting of: Mo, W, Cr, Nb, Te, and V; more preferably one or more selected from the group consisting of Mo, W and V. In another aspect of this embodiment, the metal of the metal compound is not V, preferably being one or more selected from the group consisting of: Ge, Pb, As, Se, Sb, Bi, Te, Nb, Ta, Cr, Mo and W; preferably one or more selected from the group consisting of: Mo, W, Cr, Nb and Te; more preferably one or more selected from the group consisting of Mo and W.

In one embodiment, the metal compound is a metal oxide, preferably comprising a metal and oxygen. In one aspect of this embodiment, the metal of the metal compound is one or more selected from the group consisting of Ge, Pb, As, Se, Sb, Bi, Te, Nb, Ta, Cr, Mo, W and V; preferably one or more selected from the group consisting of: Mo, W, Cr, Nb, Te, and V; more preferably one or more selected from the group consisting of Mo, W and V. In another aspect of this embodiment, the metal of the metal compound is not V, preferably being one or more selected from the group consisting of: Ge, Pb, As, Se, Sb, Bi, Te, Nb, Ta, Cr, Mo and W; preferably one or more selected from the group consisting of: Mo, W, Cr, Nb and Te; more preferably one or more selected from the group consisting of Mo and W.

In one embodiment, the metal compound is a silver metal oxide, preferably comprising silver, a metal and oxygen. In one aspect of this embodiment, the metal of the metal compound is one or more selected from the group consisting of Ge, Pb, As, Se, Sb, Bi, Te, Nb, Ta, Cr, Mo, W and V; preferably one or more selected from the group consisting of: Mo, W, Cr, Nb, Te, and V; more preferably one or more selected from the group consisting of Mo, W and V. In another aspect of this embodiment, the metal of the metal compound is not V, preferably being one or more selected from the group consisting of: Ge, Pb, As, Se, Sb, Bi, Te, Nb, Ta, Cr, Mo and W; preferably one or more selected from the group consisting of: Mo, W, Cr, Nb and Te; more preferably one or more selected from the group consisting of Mo and W.

According to one embodiment of this invention, it is preferred that the metal compound not contain Ag chemically bound to it.

In one embodiment, the metal compound comprises at least one coordinating ligand comprising at least one carbon atom, preferably a chelating ligand which coordinates at least twice to the metal. Preferred coordinating ligands comprise one or more selected from the group consisting of: N, O, S, P, or a combination thereof; preferably one or more selected from the group consisting of: N or O, or a combination thereof; more preferably at least one O atom. In one aspect, it is preferred for the coordinating ligand, preferably the chelating ligand, to comprise two or more selected from the group consisting of: N, O, S, P, or a combination thereof; preferably two or more selected from the group consisting of: N or O, or a combination thereof; more preferably at least two O atoms. The coordination of the ligand to the metal is preferably via at least one N-(metal) connection or at least one O-(metal) connection or at least one P-(metal) connection or at least one S-(metal) connection or a combination thereof. More preferably, the coordination of the ligand to the metal is via at least one N-(metal) connection or at least one O-(metal) connection or a combination thereof, most preferably at via at least one O-(metal) connection.

Preferred ligands according to the invention coordinate the metal once or more than once, preferably twice or more that twice, more preferably twice. It is preferred that the ligand coordinate the metal once, twice, thrice, four times, five times or six times; preferably twice, thrice, four times, five times or six times; more preferably twice or thrice; most preferably twice.

Preferred ligands which coordinate the metal preferably comprise one or more selected from the group consisting of: O, N, P and S, or a combination thereof; more preferably one or more selected from the group consisting of: O and N, or a combination thereof; most preferably one or more O atoms. Preferred ligands comprising O in this context are one or more selected from the group consisting of: an alcohol, an alkoxide, a carboxylic acid, a carboxylate, an aldehyde, a ketone, and an ether, or a combination thereof; more preferably one or more carboxylates. Preferred ligands comprising N in this context are one or more selected from the group consisting of: an amine, an amide, a sulphonamide, an amidine, an amine oxide, an azo compound, a carbamate, a carbodiimide, an enamine, an imide, an imine, a nitrate, a nitrile, and an oxime, or a combination thereof. Preferred ligands comprising S in this context are one or more selected from the group consisting of: a thiol, a thioether, a disulphide, and a sulfanilamide, or a combination thereof. Preferred ligands comprising P in this context are one or more selected from the group consisting of: a phosphorus halide, a phosphorus alkyl halide, a phosphorus oxide, a phosphorus alkyl oxide, a phosphorus oxy acid, and an alkyl phosphorus oxy acid, or a combination thereof.

In one embodiment, the metal compound comprises one or more ligands which are twice coordinated to the metal. Preferred ligands in this context are one or more selected from the group consisting of: acac, NacNac (β-diketiminate), ethylenedaminetetraacetate, ethylenediamine. 2-2'-bipyridine, tetra methyl ethylenediamine, 8-hydroxyquinoline, glycine, dimethylglyoxime, 2,2'-Bis(diphenylphosphino)-1,1'-binaphthyl, 1,1'-bis(diphenylphosphino)ferrocene, dimethylglyoxime, dimethylglyoxime, 8-hydroxyquinoline, oxylate, tartrate, and citrate, or a combination thereof, preferably acac.

In one embodiment, the metal comprises one or more ligands which are thrice coordinated to the metal. Preferred ligands in this context are one or more selected from the group consisting of: terpyridine, diethylenetriamine, trispyrazolylborate, iminodiacetate and 2-(2-Aminoethylaminoethanol).

In one embodiment, the metal compound comprises one or more ligands which are four times coordinated to the metal. Preferred ligands in this context are one or more selected from the group consisting of: Triethylenetetramine, Porphyrin, Nitrilotriacetate, Bis(salicylidene)ethylendiamine.

In one embodiment, the metal compound has the general formula

$M_l O_m L_n$

Wherein M is the metal;
l is 1 or 2, preferably 1;
m is 1 or 2;
L is an organic moiety, and the individual L may be the same as or different to each other;
n is in the range from 1 to 5.

In one aspect of this embodiment, the metal compound has a formula selected from the group consisting of: MOL, $MOL_2$ $MOL_3$, $MOL_4$, $MOL_5$, $MO_2L$, $MO_2L_2$, $MO_2L_3$, and $MO_2L_4$; preferably $MO_2L_2$ or $MOL_2$; wherein the L in the molecule may be the same as or different to each other.

In a further aspect of this embodiment, the metal compound comprises two or more metal atoms, preferably having the general formula $M_2O_2L_x$, wherein M is a metal, preferably Mo, L is a ligand, preferably acac, and x is a positive integer, preferably 2, 3 or 4, more preferably 3 or 4, most preferably 4.

In one embodiment, the metal compound is one or more selected from the group consisting of: $MoO_2(acac)_2$, $WO_2(acac)_2$, $CrO_2(acac)_2$, $NbO_2(acac)_2$ and $TeO_2(acac)_2$, preferably $MoO_2(acac)_2$ or $WO_2(acac)_2$, or both, most preferably $MoO_2(acac)_2$.

In another embodiment, the metal compound is an organic vanadium oxide, preferably $VO(acac)_2$.

In one embodiment, the metal compound has a general formula $M_xO_y$, wherein: M is a metal;
x is an integer, preferably in the range from about 1 to about 4;
y is an integer, preferably in the range from about 1 to about 20, more preferably in the range from about 1 to about 10, most preferably in the range from about 1 to about 4;

In one aspect of this embodiment, the metal compound has a formula selected from the group consisting of: $MO_2$, $MO_3$, $M_2O_3$, $M_2O_4$, $M_2O_5$, $M_2O_6$, $M_2O_7$, $M_3O_5$, $M_3O_6$, $M_3O_7$, $M_3O_8$, $M_3O_9$, $M_3O_{10}$, $M_4O_7$, $M_4O_8$, $M_4O_9$, $M_4O_{10}$, $M_4O_{11}$, $M_4O_{12}$, $M_4O_{13}$, $M_4O_{14}$.

In one aspect of this embodiment, the metal compound is one or more selected from the group consisting of: $W_2O_3$, $WO_2$, $WO_3$, $W_2O_5$, $MoO_2$, $MoO_3$, $CrO$, $Cr_2O_3$, $CrO_2$, $CrO_3$, $CrO_5$, $Cr_8O_{21}$, $NbO$, $NbO_2$, $Nb_2O_5$, $TeO$, $TeO_2$, $TeO_3$, $Sb_2O_4$, $Sb_2O_3$, $Sb_2O_5$, $VO$, $V_2O_3$, $VO_2$ and $V_2O_5$ or a combination thereof; preferably one or more selected from $WO_3$ and $MoO_3$.

In one embodiment, the metal compound has a general formula $M_xL_y$, wherein:
M is a metal;
x is an integer, preferably 1 or 2, more preferably 1;
L in an organic moiety;
y in an integer, preferably in the range from about 1 to about 5.

In one aspect of this embodiment, the metal compound has a formula selected from the group consisting of: ML, $ML_2$, $ML_3$, $ML_4$, $ML_5$, $ML_6$, $M_2L_2$, $M_2L_3$, $M_2L_4$, $M_2L_5$, $M_2L_6$, $M_2L_7$, $M_2L_8$, $M_2L_9$ and $M_2L_{10}$.

In one aspect of this embodiment, the metal compound is $V(acac)_2$ or $V(acac)_3$ or both.

In one embodiment of the invention, the metal compound is a binary oxide with the general formula $Ag_xM_yO_z$, wherein M stands for a metal other than Ag and x, y and z are positive integers which may take on different values depending on M. In a preferred general formula $Ag_xM_yO_z$, x is an integer in the range from 1 to 5, preferably 1 or 2, y is 1, z is an integer in the range from 1 to 6, preferably 3 or 4.

In one embodiment, the metal compound is one or more selected from the group consisting of: $AgV_7O_{18}$, $Ag_2V_4O_{11}$, $AgVO_3$, $Ag_4V_2O_7$, $Ag_2Mo_4O_{13}$, $Ag_2Mo_2O_7$, $Ag_2MoO_4$, $AgVMoO_6$, $Ag_2WO_4$, $AgCrO_2$, $Ag_2CrO_4$, $AgMnO_4$, $AgNb_7O_{18}$, $Ag_2Nb_4O_{11}$, $AgNbO_3$, $AgSnO_2$, $Ag_5Pb_2O_6$, $Ag_2SeO_4$, $Ag_2TeO_4$, $Ag_2TeO_3$, $Ag_2Te_4O_{11}$, $Ag_3AsO_4$, $AgSbO_3$, $Ag_{25}Bi_3O_{18}$, $Ag_3BiO_3$, $Ag_5BiO_4$, $Ag_2SiO_3$, $Ag_4SiO_4$, $Ag_2Si_2O_5$, $Ag_6Si_2O_7$, $Ag_{10}Si_4O_{13}$, $Ag_2SeO_4$; preferably one or more selected from the group consisting of: $AgVO_3$, $Ag_4V_2O_7$, $AgCrO_2Ag_2MoO_4$, $AgVMoO_6Ag_2WO_4$, $Ag_2SeO_4$, $Ag_2TeO_4$, $Ag_2TeO_3$, $Ag_2Te_4O_{11}$, $AgSbO_3$, $AgNbO_3$, $Ag_2SiO_3$, $Ag_4SiO_4$, $Ag_2Si_2O_5$; more preferably one or more selected from the group consisting of: $AgVO_3$, $Ag_2MoO_4$, $Ag_2WO_4$.

In one embodiment it is preferred for the compound not to be present as a constituent of a composite material. In one aspect of this embodiment, the metal compound is not part of an inorganic reaction system, preferably not part of a glass. In another aspect of this embodiment, the metal compound is present in the form of particles in which the metal compound is at least about 60 wt. %, preferably at least about 90 wt. %, more preferably at least about 99 wt. % of the particles.

Metallic Particles

Preferred metallic particles in the context of the present invention are those which exhibit metallic conductivity or which yield a substance which exhibits metallic conductivity on firing. Metallic particles present in the electro-conductive paste gives metallic conductivity to the solid electrode which is formed when the electro-conductive paste is sintered on firing. Metallic particles which favour effective sintering and yield electrodes with high conductivity and low contact resistance are preferred. Metallic particles are well known to the person skilled in the art. All metallic particles known to the person skilled in the art and which he considers suitable in the context of the present invention can be employed as the metallic particles in the electro-conductive paste. Preferred metallic particles according to the present invention are metals, alloys, mixtures of at least two metals, mixtures of at least two alloys or mixtures of at least one metal with at least one alloy.

Preferred metals which can be employed as metallic particles according to the present invention are Ag, Cu, Al, Zn, Pd, Ni or Pb and mixtures of at least two thereof, preferably Ag. Preferred alloys which can be employed as metallic particles according to the present invention are alloys containing at least one metal selected from the list of Ag, Cu, Al, Zn, Ni, W, Pb and Pd or mixtures or two or more of those alloys.

In one embodiment according to the present invention, the metallic particles comprise a metal or alloy coated with one or more further different metals or alloys, for example copper coated with silver.

In one embodiment according to the present invention, the metallic particles comprise Ag. In another embodiment according to the present invention, the metallic particles comprise a mixture of Ag with Al.

As additional constituents of the metallic particles, further to above mentioned constituents, those constituents which contribute to more favourable sintering properties, electrical contact, adhesion and electrical conductivity of the formed electrodes are preferred according to the present invention. All additional constituents known to the person skilled in the art and which he considers to be suitable in the context of the present invention can be employed in the metallic particles. Those additional substituents which represent complementary dopants for the face to which the electro-conductive paste is to be applied are preferred according to the present invention. When forming an electrode interfacing with an n-type doped Si layer, additives capable of acting as n-type dopants in Si are preferred. Preferred n-type dopants in this context are group 15 elements or compounds which yield such elements on firing. Preferred group 15 elements in this context according to the present invention are P and Bi. When forming an electrode interfacing with a p-type doped Si layer, additives capable of acting as p-type dopants in Si are preferred. Preferred p-type dopants are group 13 elements or compounds which yield such elements on firing. Preferred group 13 elements in this context according to the present invention are B and Al.

It is well known to the person skilled in the art that metallic particles can exhibit a variety of shapes, surfaces, sizes, surface area to volume ratios, oxygen content and oxide layers. A large number of shapes are known to the person skilled in the art. Some examples are spherical, angular, elongated (rod or needle like) and flat (sheet like). Metallic particles may also be present as a combination of particles of different shapes. Metallic particles with a shape, or combination of shapes, which favours advantageous sintering, electrical contact, adhesion and electrical conductivity of the produced electrode are preferred according to the present invention. One way to characterise such shapes without considering surface nature is through the parameters length, width and thickness. In the context of the present invention the length of a particle is given by the length of the longest spatial displacement vector, both endpoints of which are contained within the particle. The width of a particle is given by the length of the longest spatial displacement vector perpendicular to the length vector defined above both endpoints of which are contained within the particle. The thickness of a particle is given by the length of the longest spatial displacement vector perpendicular to both the length vector and the width vector, both defined above, both endpoints of which are contained within the particle. In one embodiment according to the present invention, metallic particles with shapes as uniform as possible are preferred i.e. shapes in which the ratios relating the length, the width and the thickness are as close as possible to 1, preferably all ratios lying in a range from 0.7 to 1.5, more preferably in a range from 0.8 to 1.3 and most preferably in a range from 0.9 to 1.2. Examples of preferred shapes for the metallic particles in this embodiment are therefore spheres and cubes, or combinations thereof, or combinations of one or more thereof with other shapes. In another embodiment according to the present invention, metallic particles are preferred which have a shape of low uniformity, preferably with at least one of the ratios relating the dimensions of length, width and thickness being above 1.5, more preferably above 3 and most preferably above 5. Preferred shapes according to this embodiment are flake shaped, rod or needle shaped, or a combination of flake shaped, rod or needle shaped with other shapes.

A variety of surface types are known to the person skilled in the art. Surface types which favour effective sintering and yield advantageous electrical contact and conductivity of produced electrodes are favoured for the surface type of the metallic particles according to the present invention.

Another way to characterise the shape and surface of a metallic particle is by its surface area to volume ratio. The lowest value for the surface area to volume ratio of a particle is embodied by a sphere with a smooth surface. The less uniform and uneven a shape is, the higher its surface area to volume ratio will be. In one embodiment according to the present invention, metallic particles with a high surface area to volume ratio are preferred, preferably in a range from $1.0 \times 10^7$ to $1.0 \times 10^9$ m$^{-1}$, more preferably in a range from $5.0 \times 10^7$ to $5.0 \times 10^8$ m$^{-1}$ and most preferably in a range from $1.0 \times 10^8$ to $5.0 \times 10^8$ m$^{-1}$. In another embodiment according to the present invention, metallic particles with a low surface area to volume ratio are preferred, preferably in a range from $6 \times 10^5$ to $8.0 \times 10^6$ m$^{-1}$, more preferably in a range from $1.0 \times 10^6$ to $6.0 \times 10^6$ m$^{-1}$ and most preferably in a range from $2.0 \times 10^6$ to $4.0 \times 10^6$ m$^{-1}$.

The particles diameter $d_{50}$ and the associated values $d_{10}$ and $d_{90}$ are characteristics of particles well known to the person skilled in the art. It is preferred according to the present invention that the average particle diameter $d_{50}$ of the metallic particles lie in a range from 0.5 to 10 μm, more preferably in a range from 1 to 10 μm and most preferably in a range from 1 to 5 μm. The determination of the particles diameter $d_{50}$ is well known to a person skilled in the art.

The metallic particles may be present with a surface coating. Any such coating known to the person skilled in the art and which he considers to be suitable in the context of the present invention can be employed on the metallic particles. Preferred coatings according to the present invention are those coatings which promote improved printing, sintering and etching characteristics of the electro-conductive paste. If such a coating is present, it is preferred according to the present invention for that coating to correspond to no more than 10 wt. %, preferably no more than 8 wt. %, most preferably no more than 5 wt. %, in each case based on the total weight of the metallic particles.

In one embodiment according to the present invention, the metallic particles are present as a proportion of the electro-conductive paste more than 50 wt. %, preferably more than 70 wt. %, most preferably more than 80 wt. %.

Inorganic Reaction System

Inorganic reaction system, preferably glass frit or glass, is present in the electro-conductive paste according to the invention in order to bring about etching and sintering. Preferred inorganic reaction systems are preferably either glasses, preferably glass frit or glass or materials which are capable of forming glasses on firing. Effective etching is required to etch through any additional layers which may have been applied to the Si wafer and thus lie between the front doped layer and the applied electro-conductive paste as well as to etch into the Si wafer to an appropriate extent. Appropriate etching of the Si wafer means deep enough to bring about good electrical contact between the electrode and the front doped layer and thus lead to a low contact resistance but not so deep as to interfere with the p-n junction boundary. Preferred, inorganic reaction systems, preferably glass frits or glasses, in the context of the invention are powders of amorphous or partially crystalline solids which exhibit a glass transition. The glass transition temperature $T_g$ is the temperature at which an amorphous substance transforms from a rigid solid to a partially mobile undercooled melt upon heating. Methods for the determination of the glass transition temperature are well known to the person skilled in the art. The etching and sintering brought about by the inorganic reaction system, preferably the glass frit or glass, occurs above the glass transition temperature of the inorganic reaction system, preferably the glass frit or glass, and it is preferred that the glass transition temperature lie below the desired peak firing temperature. Inorganic reaction system, preferably glass frits or glasses, are well known to the person skilled in the art. All inorganic reaction systems, preferably glass frits or glasses, known to the person skilled in the art and which he considers suitable in the context of the invention can be employed as the inorganic reaction system in the electro-conductive paste.

As mentioned above, it is preferred for the inorganic reaction system, preferably the glass frit or glass, to have a glass transition temperature below the desired firing temperature of the electro-conductive paste. In one embodiment of the invention the inorganic reaction system, preferably the glass frit or glass, has a glass transition temperature in the range from about 250 to about 530° C., more preferably in a range from about 300 to about 500° C., and most preferably in a range from about 320 to about 450° C.

It is well known to the person skilled in the art that glass frit particles can exhibit a variety of shapes, surface natures, sizes, surface area to volume ratios, and coating layers.

A large number of shapes of glass frit particles are known to the person skilled in the art. Some examples are spherical, angular, elongated (rod or needle like) and flat (sheet like). Glass frit particles may also be present as a combination of particles of different shapes. Glass frit particles with a shape, or combination of shapes, which favours advantageous sintering, adhesion, electrical contact and electrical conductivity of the produced electrode are preferred according to the invention.

The average particles diameter $d_{50}$, and the associated parameters $d_{10}$ and $d_{90}$ are characteristics of particles well known to the person skilled in the art. It is preferred according to the invention that the average particle diameter $d_{50}$ of the glass frit lies in a range from about 0.1 to about 10 μm, more preferably in a range from about 0.2 to about 7 μm and most preferably in a range from about 0.5 to about 5 μm.

In one embodiment of the invention, the glass frit particles have ads) in a range from about 0.1 to about 3 μm, preferably in a range from about 0.5 to about 2 μm, more preferably in a range from about 0.8 to about 1.5 μm.

Organic Vehicle

Preferred organic vehicles in the context of the present invention are solutions, emulsions or dispersions based on a one or more solvents, preferably an organic solvent, which ensure that the constituents of the electro-conductive paste are present in a dissolved, emulsified or dispersed form. Preferred organic vehicles are those which provide optimal stability of constituents within the electro-conductive paste and endow the electro-conductive paste with a viscosity allowing effective line printability. Preferred organic vehicles according to the present invention comprise as vehicle components:

(i) a binder, preferably in a range of 1 to 10 wt. %, more preferably in a range of 2 to 8 wt. % and most preferably in a range of 3 to 7 wt. %;

(ii) a surfactant, preferably in a range of 0 to 10 wt. %, more preferably in a range of 0 to 8 wt. % and most preferably in a range of 0.1 to 6 wt. %;

(ii) one or more solvents, the proportion of which is determined by the proportions of the other constituents in the organic vehicle;

(iv) additives, preferably in range of 0 to 15 wt. %, more preferably in a range of 0 to 13 wt. % and most preferably in a range of 5 to 11 wt. %, wherein the wt. % are each based on the total weight of the organic vehicle and add up to 100 wt. %. According to the present invention preferred organic vehicles are those which allow for the preferred high level of printability of the electro-conductive paste described above to be achieved.

Binder

Preferred binders in the context of the present invention are those which contribute to the formation of an electro-conductive paste with favourable stability, printability, viscosity, sintering and etching properties. Binders are well known to the person skilled in the art. All binders which are known to the person skilled in the art and which he considers to be suitable in the context of this invention can be employed as the binder in the organic vehicle. Preferred binders according to the present invention (which often fall within the category termed "resins") are polymeric binders, monomeric binders, and binders which are a combination of polymers and monomers. Polymeric binders can also be copolymers where at least two different monomeric units are contained in a single molecule. Preferred polymeric binders are those which carry functional groups in the polymer main chain, those which carry functional groups off of the main chain and those which carry functional groups both within the main chain and off of the main chain. Preferred polymers carrying functional groups in the main chain are for example polyesters, substituted polyesters, polycarbonates, substituted polycarbonates, polymers which carry cyclic groups in the main chain, poly-sugars, substituted poly-sugars, polyurethanes, substituted polyurethanes, polyamides, substituted polyamides, phenolic resins, substituted phenolic resins, copolymers of the monomers of one or more of the preceding polymers, optionally with other co-monomers, or a combination of at least two thereof. Preferred polymers which carry cyclic groups in the main chain are for example polyvinylbutylate (PVB) and its derivatives and poly-terpineol and its derivatives or mixtures thereof. Preferred poly-sugars are for example cellulose and alkyl derivatives thereof, preferably methyl cellulose, ethyl cellulose, propyl cellulose, butyl cellulose and their derivatives and mixtures of at least two thereof. Preferred polymers which carry functional groups off of the main polymer chain are those which carry amide groups, those which carry acid and/or ester groups, often called acrylic resins, or polymers which carry a combination of aforementioned functional groups, or a combination thereof. Preferred polymers which carry amide off of the main chain are for example polyvinyl pyrrolidone (PVP) and its derivatives. Preferred polymers which carry acid and/or ester groups off of the main chain are for example polyacrylic acid and its derivatives, polymethacrylate (PMA) and its derivatives or polymethylmethacrylate (PMMA) and its derivatives, or a mixture thereof. Preferred monomeric binders according to the present invention are ethylene glycol based monomers, terpineol resins or rosin derivatives, or a mixture thereof. Preferred monomeric binders based on ethylene glycol are those with ether groups, ester groups or those with an ether group and an ester group, preferred ether groups being methyl, ethyl, propyl, butyl, pentyl hexyl and higher alkyl ethers, the preferred ester group being acetate and its alkyl derivatives, preferably ethylene glycol monobutylether monoacetate or a mixture thereof. Alkyl cellulose, preferably ethyl cellulose, its derivatives and mixtures thereof with other binders from the preceding lists of binders or otherwise are the most preferred binders in the context of the present invention.

Surfactant

Preferred surfactants in the context of the present invention are those which contribute to the formation of an electro-conductive paste with favourable stability, printability, viscosity, sintering and etching properties. Surfactants are well known to the person skilled in the art. All surfactants which are known to the person skilled in the art and which he considers to be suitable in the context of this invention can be employed as the surfactant in the organic vehicle. Preferred surfactants in the context of the present invention are those based on linear chains, branched chains, aromatic chains, fluorinated chains, siloxane chains, polyether chains and combinations thereof. Preferred surfactants are single chained double chained or poly chained. Preferred surfactants according to the present invention have non-ionic, anionic, cationic, or zwitterionic heads. Preferred surfactants are polymeric and monomeric or a mixture thereof. Preferred surfactants according to the present invention can have pigment affinic groups, preferably hydroxy-functional carboxylic acid esters with pigment affinic groups (e.g., DISPERBYK®-108, manufactured by BYK USA, Inc.), acrylate copolymers with pigment affinic groups (e.g., DISPERBY®-116, manufactured by BYK USA, Inc.), modified polyethers with pigment affinic groups (e.g., TEGO® DISPERS 655, manufactured by Evonik Tego Chemie GmbH), other surfactants with groups of high pigment affinity (e.g., TEGO® DISPERS 662 C, manufactured by Evonik Tego Chemie GmbH). Other preferred polymers according to the present invention not in the above list are polyethyleneglycol and its derivatives, and alkyl carboxylic acids and their derivatives or salts, or mixtures thereof. The preferred polyethyleneglycol derivative according to the present invention is poly(ethyleneglycol)acetic acid. Preferred alkyl carboxylic acids are those with fully saturated and those with singly or poly unsaturated alkyl chains or mixtures thereof. Preferred carboxylic acids with saturated alkyl chains are those with alkyl chains lengths in a range from 8 to 20 carbon atoms, preferably $C_9H_{19}COOH$ (capric acid), $C_{11}H_{23}COOH$ (Lauric acid), $C_{13}H_{27}COOH$ (myristic acid) $C_{15}H_{31}COOH$ (palmitic acid), $C_{17}H_{35}COOH$ (stearic acid) or mixtures thereof. Preferred carboxylic acids with unsaturated alkyl chains are $C_{18}H_{34}O_2$ (oleic acid) and $C_{18}H_{32}O_2$ (linoleic acid). The preferred monomeric surfactant according to the present invention is benzotriazole and its derivatives.

Solvent

Preferred solvents according to the present invention are constituents of the electro-conductive paste which are removed from the paste to a significant extent during firing, preferably those which are present after firing with an absolute weight reduced by at least 80% compared to before firing, preferably reduced by at least 95% compared to before firing. Preferred solvents according to the present invention are those which allow an electro-conductive paste to be formed which has favourable viscosity, printability, stability and sintering characteristics and which yields electrodes with favourable electrical conductivity and electrical contact to the substrate. Solvents are well known to the person skilled in the art. All solvents which are known to the person skilled in the art and which he considers to be suitable in the context of this invention can be employed as the solvent in the organic vehicle. According to the present invention preferred solvents are those which allow the preferred high level of printability of the electro-conductive paste as described above to be achieved. Preferred solvents according to the present invention are those which exist as a liquid under standard ambient temperature and pressure (SATP) (298.15 K, 25° C., 77° F.), 100 kPa (14.504 psi, 0.986 atm), preferably those with a boiling point above 90° C. and a melting point above −20° C. Preferred solvents according to the present invention are polar or non-polar, protic or aprotic, aromatic or non-aromatic. Preferred solvents according to the present invention are mono-alcohols, di-alcohols, polyalcohols, mono-esters, di-esters, poly-esters, mono-ethers, di-ethers, poly-ethers, solvents which comprise at least one or more of these categories of functional group, optionally comprising other categories of functional group, preferably cyclic groups, aromatic groups, unsaturated-bonds, alcohol groups with one or more O atoms replaced by heteroatoms, ether groups with one or more O atoms replaced by heteroatoms, esters groups with one or more O atoms replaced by heteroatoms, and mixtures of two or more of the aforementioned solvents. Preferred esters in this context are di-alkyl esters of adipic acid, preferred alkyl constituents being methyl, ethyl, propyl, butyl, pentyl, hexyl and higher alkyl groups or combinations of two different such alkyl groups, preferably dimethyladipate, and mixtures of two or more adipate esters. Preferred ethers in this context are diethers, preferably dialkyl ethers of ethylene glycol, preferred alkyl constituents being methyl, ethyl, propyl, butyl, pentyl, hexyl and higher alkyl groups or combinations of two different such alkyl groups, and mixtures of two diethers. Preferred alcohols in this context are primary, secondary and tertiary alcohols, preferably tertiary alcohols, terpineol and its derivatives being preferred, or a mixture of two or more alcohols. Preferred solvents which combine more than one different functional groups are 2,2,4-trimethyl-1,3-pentanediol monoisobutyrate, often called texanol, and its derivatives, 2-(2-ethoxyethoxy)ethanol, often known as carbitol, its alkyl derivatives, preferably methyl, ethyl, propyl, butyl, pentyl, and hexyl carbitol, preferably hexyl carbitol or butyl carbitol, and acetate derivatives thereof, preferably butyl carbitol acetate, or mixtures of at least 2 of the aforementioned.

Additives in the Organic Vehicle

Preferred additives in the organic vehicle are those additives which are distinct from the aforementioned vehicle components and which contribute to favourable properties of the electro-conductive paste, such as advantageous viscosity, sintering, electrical conductivity of the produced electrode and good electrical contact with substrates. All additives known to the person skilled in the art and which he considers to be suitable in the context of the present invention can be employed as additive in the organic vehicle. Preferred additives according to the present invention are thixotropic agents, viscosity regulators, stabilising agents, inorganic additives, thickeners, emulsifiers, dispersants or pH regulators. Preferred thixotropic agents in this context are carboxylic acid derivatives, preferably fatty acid derivatives or combinations thereof. Preferred fatty acid derivatives are $C_9H_{19}COOH$ (capric acid), $C_{11}H_{23}COOH$ (Lauric acid), $C_{13}H_{27}COOH$ (myristic acid) $C_{15}H_{31}COOH$ (palmitic acid), $C_{17}H_{35}COOH$ (stearic acid) $C_{18}H_{34}O_2$ (oleic acid), $C_{18}H_{32}O_2$ (linoleic acid) or combinations thereof. A preferred combination comprising fatty acids in this context is castor oil.

Additives in the Electro-Conductive Paste

Preferred additives in the context of the present invention are constituents added to the electro-conductive paste, in addition to the other constituents explicitly mentioned, which contribute to increased performance of the electro-conductive paste, of the electrodes produced thereof or of the resulting solar cell. All additives known to the person skilled in the art and which he considers suitable in the context of the present invention can be employed as additive in the electro-conductive paste. In addition to additives present in the vehicle, additives can also be present in the electro-conductive paste. Preferred additives according to the present invention are thixotropic agents, viscosity regulators, emulsifiers, stabilising agents or pH regulators, inorganic additives, thickeners and dispersants or a combination of at least two thereof, whereas inorganic additives are most preferred. Preferred inorganic additives in this context according to the present invention are Mg, Ni, Te, W, Zn, Gd, Ce, Zr, Ti, Mn, Sn, Ru, Co, Fe, Cu and Cr or a combination of at least two thereof, preferably Zn, Sb, Mn, Ni, W, Te and Ru or a combination of at least two thereof, or a mixture of at least two of the aforementioned metals.

Precursor

Preferred precursors in the context of the invention comprise:
1. A wafer, preferably a Si wafer, preferably with a p-n junction, preferably having at least a p-type face and a n-type face;
2. A paste according to the invention superimposed over a p-type doped face of the wafer.

In one embodiment, the paste is further applied to an n-type face of the wafer.

In one embodiment, the wafer has a n-type face and a p-type face on the same side of the wafer.

Process for Producing a Solar Cell

A contribution to achieving at one of the aforementioned objects is made by a process for producing a solar cell at least comprising the following as process steps:
i) provision of a solar cell precursor as described above, in particular combining any of the above described embodiments; and
ii) firing of the solar cell precursor to obtain a solar cell.

Printing

It is preferred according to the present invention that the front and back electrodes are applied by applying an electro-conductive paste and then firing said electro-conductive paste to obtain a sintered body. The electro-conductive paste can be applied in any manner known to the person skilled in that art and which he considers suitable in the context of the present invention including but not limited to impregnation, dipping, pouring, dripping on, injection, spraying, knife coating, curtain coating, brushing or printing or a combination of at least two thereof, wherein preferred printing techniques are ink-jet printing, screen printing, tampon printing, offset printing, relief printing or stencil printing or a combination of at least two thereof. It is preferred according to the present invention that the electro-conductive paste is applied by printing, preferably by screen printing. It is preferred according to the present invention that the screens have mesh opening with a diameter in a range from 15 to 100 µm, more preferably in a range from 20 to 80 µm, and most preferably in a range from 25 to 70 µm.

Firing

It is preferred according to the present invention for electrodes to be formed by first applying an electro-conductive paste and then firing said electro-conductive paste to yield a solid electrode body. Firing is well known to the person skilled in the art and can be effected in any manner known to him and which he considers suitable in the context of the present invention. Firing must be carried out above the glass transition temperature of the glass frit.

According to the present invention the maximum temperature set for the firing is below 900° C., preferably below 860° C. Firing temperatures as low as 820° C. have been employed for obtaining solar cells. It is preferred according to the present invention for firing to be carried out in a fast firing process with a total firing time in the range from 30 s to 3 minutes, more preferably in the range from 30 s to 2 minutes and most preferably in the range from 40 s to 1 minute. The time above 600° C. is most preferably from 3 to 7 s.

Firing of electro-conductive pastes on the front and back faces can be carried out simultaneously or sequentially. Simultaneous firing is appropriate if the electro-conductive pastes applied to both faces have similar, preferably identical, optimum firing conditions. Where appropriate, it is preferred according to the present invention for firing to be carried out simultaneously. Where firing is affected sequentially, it is preferable according to the present invention for the back electro-conductive paste to be applied and fired first, followed by application and firing of the electro-conductive paste to the front face.

Solar Cell

A contribution to achieving at least one of the above described objects is made by a solar cell obtainable by a process according to the present invention. Preferred solar cells according to the present invention are those which have a high efficiency in terms of proportion of total energy of incident light converted into electrical energy output and which are light and durable. The common configuration of a solar cell according to the present invention (excluding layers which are purely for chemical and mechanical protection) is as depicted in FIG. 2. The layer configuration shown there is given as follows: (i) Front electrode, (ii) Anti reflection coating, (iii) Front passivation layer, (iv) Front doped layer, (v) p-n junction boundary, (vi) Back doped layer, (vii) Highly doped back layer, (viii) Back passivation layer, (ix) Back electrode. Individual layers can be omitted from this common layer configuration or individual layers can indeed perform the function of more than one of the layers described in the common embodiment outlined above. In one embodiment of the present invention, a single layer acts as both anti-reflection layer and passivation layer. The minimum required layer configuration is given in FIG. 1. This minimum layer configuration is as follows: (I) Front electrode, (II) Front doped layer, (III) p-n junction boundary, (IV) Back doped layer, (V) Back electrode.

In one embodiment of the invention, the solar cell comprises a wafer with a sheet resistance of at least 80 Ohm/sq., preferably at least 90 Ohm/sq. more preferably at least 100 Ohm/sq. In some cases, a maximum value of 200 Ohm/sq. is observed for the sheet resistance of high Ohmic wafers.

Anti-Reflection Coating

According to the present invention, an anti-reflection coating can be applied as the outer and often as the outermost layer before the electrode on the front face of the solar cell. Preferred anti-reflection coatings according to the present invention are those which decrease the proportion of incident light reflected by the front face and increase the proportion of incident light crossing the front face to be absorbed by the wafer. Anti-reflection coatings which give rise to a favourable absorption/reflection ratio, are susceptible to etching by the employed electro-conductive paste but are otherwise resistant to the temperatures required for firing of the electro-conductive paste, and do not contribute to increased recombination of electrons and holes in the vicinity of the electrode interface are favoured. All anti-reflection coatings known to the person skilled in the art and which he considers to be suitable in the context of the present invention can be employed. Preferred anti-reflection coatings according to the present invention are $SiN_x$, $SiO_2$, $Al_2O_3$, $TiO_2$ or mixtures of at least two thereof and/or combinations of at least two layers thereof, wherein $SiN_x$ is particularly preferred, in particular where an Si wafer is employed.

The thickness of anti-reflection coatings is suited to the wavelength of the appropriate light. According to the present invention it is preferred for anti-reflection coatings to have a thickness in a range from 20 to 300 nm, more preferably in a range from 40 to 200 nm and most preferably in a range from 60 to 90 nm.

Passivation Layers

According to the present invention, one or more passivation layers can be applied to the front and/or back side as outer or as the outermost layer before the electrode, or before the anti-reflection layer if one is present. Preferred passivation layers are those which reduce the rate of electron/hole recombination in the vicinity of the electrode interface. Any passivation layer which is known to the person skilled in the art and which he considers to be suitable in the context of the present invention can be employed. Preferred passivation layers according to the present invention are silicon nitride, silicon dioxide and titanium dioxide, silicon nitride being most preferred. According to the present invention, it is preferred for the passivation layer to have a thickness in a range from 0.1 nm to 2 µm, more preferably in a range from 10 nm to 1 µm and most preferably in a range from 30 nm to 200 nm.

Additional Protective Layers

In addition to the layers described above which directly contribute to the principle function of the solar cell, further layers can be added for mechanical and chemical protection. The cell can be encapsulated to provide chemical protection. Encapsulations are well known to the person skilled in the art and any encapsulation can be employed which is known to him and which he considers suitable in the context of the present invention. According to the present invention, transparent polymers, often referred to as transparent thermoplastic resins, are preferred as the encapsulation material, if such an encapsulation is present. Preferred transparent polymers in this context are for example silicon rubber and polyethylene vinyl acetate (PVA).

A transparent glass sheet can be added to the front of the solar cell to provide mechanical protection to the front face of the cell. Transparent glass sheets are well known to the person skilled in the art and any transparent glass sheet known to him and which he considers to be suitable in the context of the present invention can be employed as protection on the front face of the solar cell.

A back protecting material can be added to the back face of the solar cell to provide mechanical protection. Back protecting materials are well known to the person skilled in the art and any back protecting material which is known to the person skilled in the art and which he considers to be suitable in the context of the present invention can be employed as protection on the back face of the solar cell. Preferred back protecting materials according to the present invention are those having good mechanical properties and weather resistance. The preferred back protection materials according to the present invention is polyethylene terephthalate with a layer of polyvinyl fluoride. It is preferred according to the present invention for the back protecting material to be present underneath the encapsulation layer (in the event that both a back protection layer and encapsulation are present).

A frame material can be added to the outside of the solar cell to give mechanical support. Frame materials are well known to the person skilled in the art and any frame material known to the person skilled in the art and which he considers suitable in the context of the present invention can be employed as frame material. The preferred frame material according to the present invention is aluminium.

Solar Panels

A contribution to achieving at least one of the above mentioned objects is made by a module comprising at least a solar cell obtained as described above, in particular according to at least one of the above described embodiments, and at least one more solar cell. A multiplicity of solar cells according to the present invention can be arranged spatially and electrically connected to form a collective arrangement called a module. Preferred modules according to the present invention can take a number of forms, preferably a rectangular surface known as a solar panel. A large variety of ways to electrically connect solar cells as well as a large variety of ways to mechanically arrange and fix such cells to form collective arrangements are well known to the person skilled in the art and any such methods known to him and which he considers suitable in the context of the present invention can be employed. Preferred methods according to the present invention are those which result in a low mass to power output ratio, low volume to power output ration, and high durability. Aluminium is the preferred material for mechanical fixing of solar cells according to the present invention.

DESCRIPTION OF THE DRAWINGS

The present invention is now explained by means of figures which are intended for illustration only and are not to be considered as limiting the scope of the present invention. In brief.

FIG. 1 shows a cross sectional view of a solar cell 100 and represents the minimum required layer configuration for a solar cell according to the present invention. Starting from the back face and continuing towards the front face the solar cell 100 comprises a back electrode 104, a back doped layer 106, a p-n junction boundary 102, a front doped layer 105 and a front electrode 103, wherein the front electrode penetrates into the front doped layer 105 enough to form a good electrical contact with it, but not so much as to shunt the p-n junction boundary 102. The back doped layer 106 and the front doped layer 105 together constitute a single doped Si wafer 101. In the case that 100 represents an n-type cell, the back electrode 104 is preferably a silver electrode, the back doped layer 106 is preferably Si lightly doped with P, the front doped layer 105 is preferably Si heavily doped with B and the front electrode 103 is preferably a mixed silver and aluminium electrode. In the case that 100 represents a p-type cell, the back electrode 104 is preferably a mixed silver and aluminium electrode, the back doped layer 106 is preferably Si lightly doped with B, the front doped layer 105 is preferably Si heavily doped with P and the front electrode 103 is preferably a silver electrode. The front electrode 103 has been represented in FIG. 1 as consisting of three bodies purely to illustrate schematically the fact that the front electrode 103 does not cover the front face in its entirety. The present invention does not limit the front electrode 103 to those consisting of three bodies.

FIG. 2 shows a cross sectional view of a common layer configuration for a solar cell 200 according to the present invention (excluding additional layers which serve purely for chemical and mechanical protection). Starting from the back face and continuing towards the front face the solar cell 200 comprises a back electrode 104, a back passivation layer 208, a highly doped back layer 210, a back doped layer 106, a p-n junction boundary 102, a front doped layer 105, a front passivation layer 207, an anti-reflection layer 209, front electrode fingers 214 and front electrode bus bars 215, wherein the front electrode fingers penetrate through the anti-reflection layer 209 and the front passivation layer 207 and into the front doped layer 105 far enough to form a good electrical contact with the front doped layer, but not so far as to shunt the p-n junction boundary 102. In the case that 200 represents an n-type cell, the back electrode 104 is preferably a silver electrode, the highly doped back layer 210 is preferably Si heavily doped with P, the back doped layer 106 is preferably Si lightly doped with P, the front doped layer 105 is preferably Si heavily doped with B, the anti-reflection layer 209 is preferably a layer of silicon nitride and the front electrode fingers and bus bars 214 and 215 are preferably a mixture of silver and aluminium. In the case that 200 represents a p-type cell, the back electrode 104 is preferably a mixed silver and aluminium electrode, the highly doped back layer 210 is preferably Si heavily doped with B, the back doped layer 106 is preferably Si lightly doped with B, the front doped layer 105 is preferably Si heavily doped with P, the anti-reflection layer 209 is preferably a layer of silicon nitride and the front electrode fingers and bus bars 214 and 215 are preferably silver. FIG. 2 is schematic and the invention does not limit the number of front electrode fingers to three as shown. This cross sectional view is unable to effectively show the multitude of front electrode bus bars 215 arranged in parallel lines perpendicular to the front electrode fingers 214.

FIGS. 3a, 3b and 3c are schematic and generalised and additional layers further to those constituting the p-n junction are considered simply as optional additional layers without more detailed consideration.

FIG. 3a illustrates a wafer before application of front electrode, 300a. Starting from the back face and continuing towards the front face the wafer before application of front electrode 300a optionally comprises additional layers on the back face 311, a back doped layer 106, a p-n junction boundary 102, a front doped layer 105 and additional layers on the front face 312. The additional layers on the back face 311 can comprise any of a back electrode, a back passivation layer, a highly doped back layer or none of the above. The additional layer on the front face 312 can comprise any of a front passivation layer, an anti-reflection layer or none of the above.

FIG. 3b shows a wafer with electro-conductive paste applied to the front face before firing 300b. In addition to the layers present in 300a described above, an electro-conductive paste 313 is present on the surface of the front face.

FIG. 3c shows a wafer with front electrode applied 300c. In addition to the layers present in 300a described above, a front side electrode 103 is present which penetrates from the surface of the front face through the additional front layers 312 and into the front doped layer 105 and is formed from the electro-conductive paste 313 of FIG. 3b by firing.

In FIGS. 3b and 3c, the applied electro-conductive paste 313 and the front electrodes 103 are shown schematically as being present as three bodies. This is purely a schematic way of representing a non-complete coverage of the front face by the paste/electrodes and the present invention does not limit the paste/electrodes to being present as three bodies.

FIG. 4 shows the positioning of cuts 421 relative to finger lines 422 in the wafer 420 for the test method below to measure specific contact resistance.

FIG. 5 shows in schematic profile cross section one preferred layer structure of an interdigitated back contact cell according to the invention. The bulk of the cell is n-type doped Si 604. There is present on the front (sun receiving) side of the cell, starting at the bulk and progressing outward, a highly doped n+ layer 603; a passivation layer 602, preferably of silicon dioxide; and an anti-reflection coating 601, preferably of $SiN_x$. There is present on the back side of the cell, starting at the bulk and progressing outward, a passivation layer 605, preferably of silicon oxide; and an anti-reflection coating 606. On the back side, before the passivation layer 605, is one or more highly doped p-type doped faces 608 and one or more highly doped n-type doped faces 607. The p-type doped face(s) 608 and the n-type doped face(s) 607 are each contacted by an electrode 609 which penetrates the anti-reflection coating 606 and the passivation layer 605 to contact the doped faces. One possible layout of the electrodes 609 is shown in FIG. 6. The above arrangement based on an n-type bulk can analogously be based on a p-type bulk buy interchanging the words n-type and p-type in the above description.

FIG. 6 shows in schematic plan view the one preferred layout of the back side of an interdigitated back contact cell according to the invention. Superimposed over the Si wafer 701 are electrodes 704, preferably of silver, which contact n-type doped faces of the wafer 701. The electrodes 704 are contacted to a current collector 705. Analogously, electrodes 702, preferably of silver, are superimposed over the Si wafer 701 and contact p-type doped faces of the wafer 701. The electrodes 702 are contacted to a current collector 703.

Test Methods

The following test methods are used in the present invention. In absence of a test method, the ISO test method for the feature to be measured being closest to the earliest filing date of the present application applies. In absence of distinct measuring conditions, standard ambient temperature and pressure (SATP) as a temperature of 298.15 K (25° C., 77° F.) and an absolute pressure of 100 kPa (14.504 psi, 0.986 atm) apply.

Viscosity

Viscosity measurements were performed using the Thermo Fischer Scientific Corp. "Haake Rheostress 600" equipped with a ground plate MPC60 Ti and a cone plate C 20/0.5° Ti and software "Haake RheoWin Job Manager 4.30.0". After setting the distance zero point, a paste sample sufficient for the measurement was placed on the ground plate. The cone was moved into the measurement positions with a gap distance of 0.026 mm and excess material was removed using a spatula. The sample was equilibrated to 25° C. for three minutes and the rotational measurement started.

The shear rate was increased from 0 to 20 s$^{-1}$ within 48 s and 50 equidistant measuring points and further increased to 150 s$^{-1}$ within 312 s and 156 equidistant measuring points. After a waiting time of 60 s at a shear rate of 150 s$^{-1}$, the shear rate was reduced from 150 s$^{-1}$ to 20 s$^{-1}$ within 312 s and 156 equidistant measuring points and further reduced to 0 within 48 s and 50 equidistant measuring points. The micro torque correction, micro stress control and mass inertia correction were activated. The viscosity is given as the measured value at a shear rate of 100 s$^{-1}$ of the downward shear ramp.

Specific Contact Resistance

In an air conditioned room with a temperature of 22±1° C., all equipment and materials are equilibrated before the measurement. For measuring the specific contact resistance of fired silver electrodes on the front doped layer of a silicon solar cell a "GP4-Test Pro" equipped with the "GP-4 Test 1.6.6 Pro" software package from the company GP solar GmbH is used.

Figure 1:
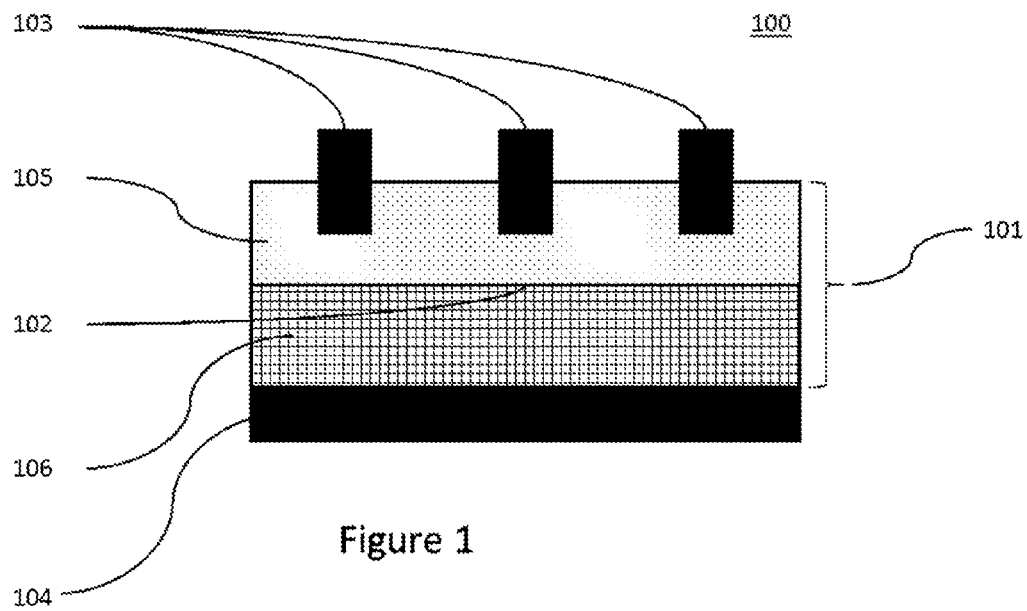
FIG. 1 shows a cross sectional view of the minimum layer configuration for a solar cell.
Figure 2:
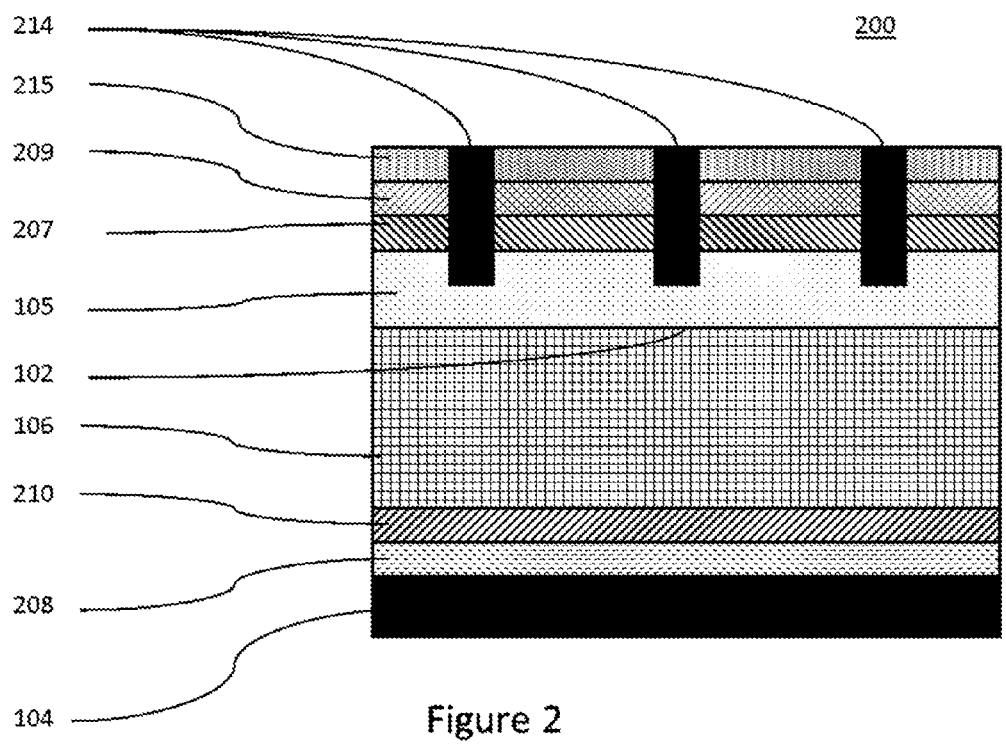
FIG. 2 shows a cross sectional view a common layer configuration for a solar cell, FIGS. 3a, 3b and 3c together illustrate the process of firing a front side paste.
Figure 3A:
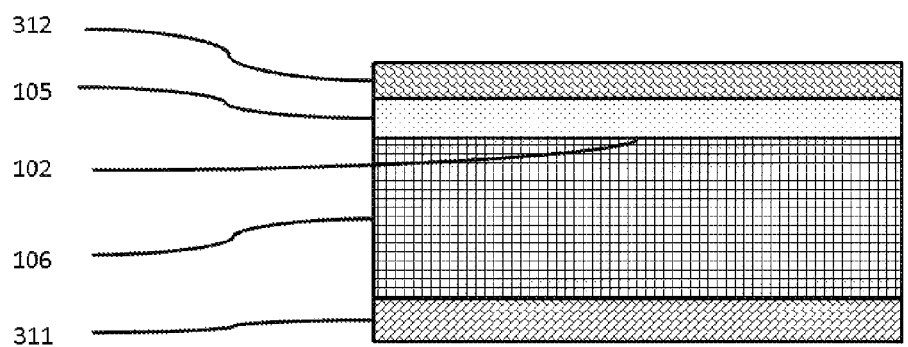
FIGS. 3a, 3b and 3c together illustrate the process of firing a front side paste to yield a front side electrode.
Figure 3B:
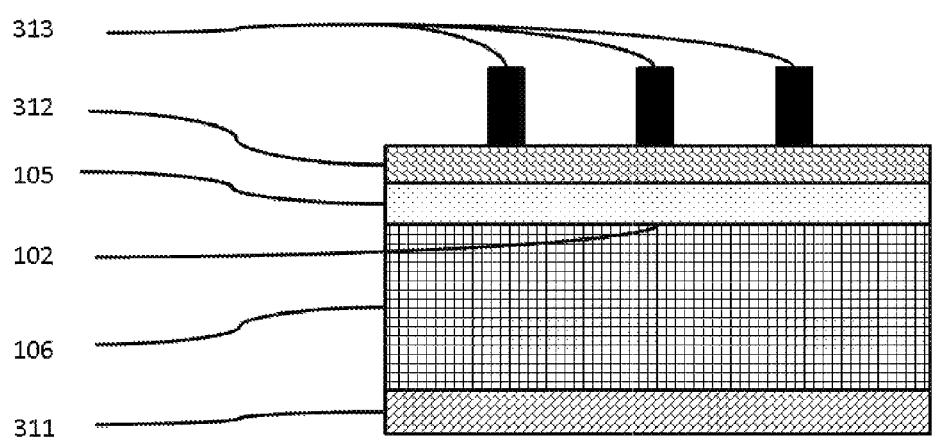
Figure 3C:
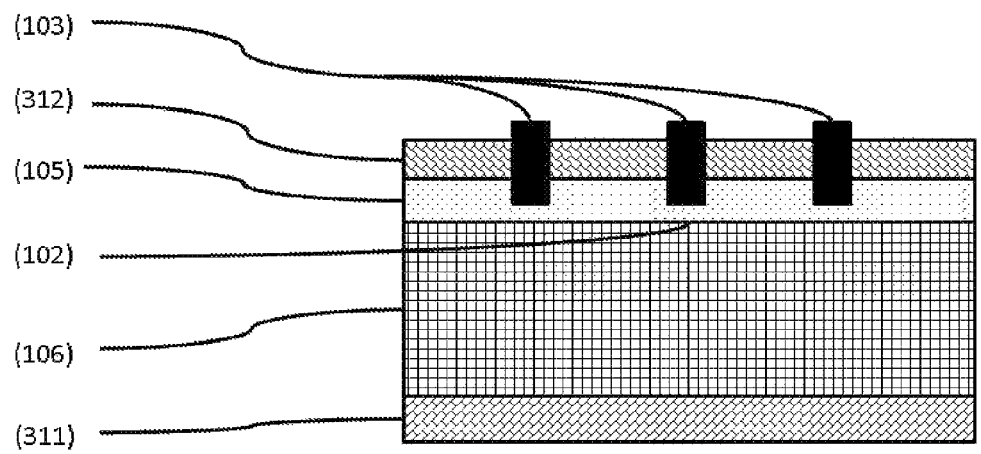
Figure 4:
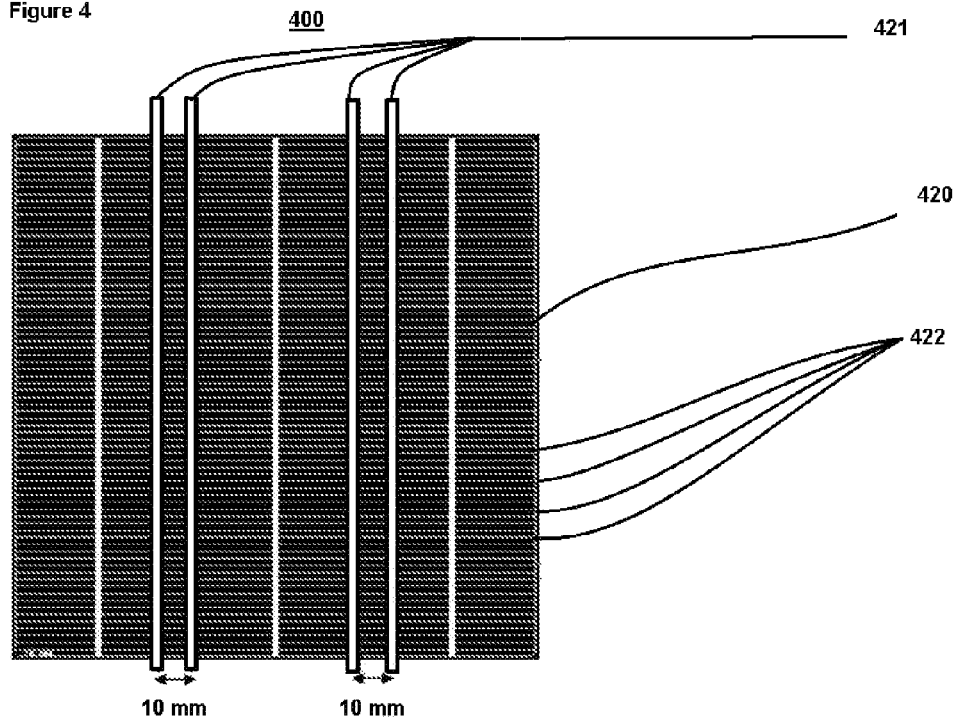
FIG. 4 shows the positioning of cuts for the test method below to measure specific contact resistance.
Figure 5:
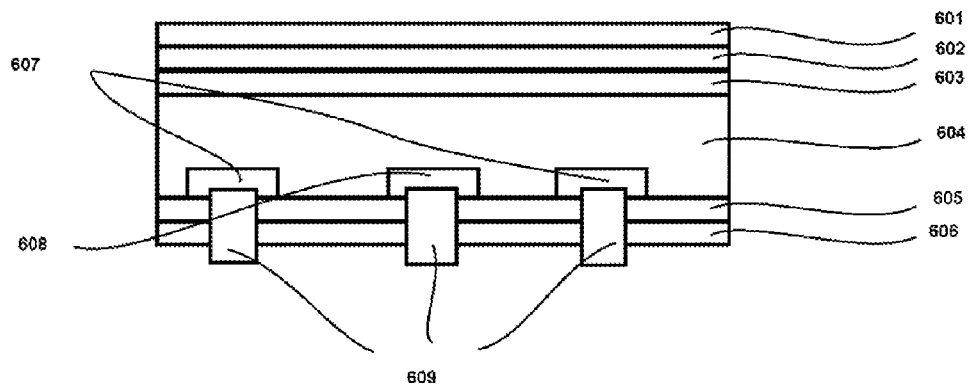
FIG. 5 shows a profile cross section of an interdigitated back contact cell according to the invention
Figure 6:
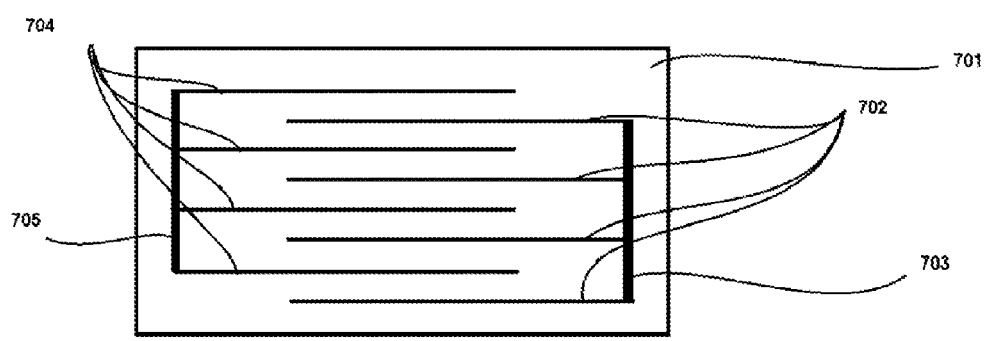
FIG. 6 shows a view of the back side of an interdigitated back contact cell according to the invention

This device applies the 4 point measuring principle and estimates the specific contact resistance by the transfer length method (TLM). To measure the specific contact resistance, two 1 cm wide stripes of the wafer are cut perpendicular to the printed finger lines of the wafer as shown in FIG. 4. The exact width of each stripe is measured by a micrometer with a precision of 0.05 mm. The width of the fired silver fingers is measured on 3 different spots on the stripe with a digital microscope "VHX-600D" equipped with a wide-range zoom lens VH-Z100R from the company Keyence Corp. On each spot, the width is determined ten times by a 2-point measurement. The finger width value is the average of all 30 measurements. The finger width, the stripe width and the distance of the printed fingers to each other is used by the software package to calculate the specific contact resistance. The measuring current is set to 14 mA. A multi contact measuring head (part no. 04.01.0016) suitable to contact 6 neighboring finger lines is installed and brought into contact with 6 neighboring fingers. The measurement is performed on 5 spots equally distributed on each stripe. After starting the measurement, the software determines the value of the specific contact resistance (mOhm*cm$^2$) for each spot on the stripes. The average of all ten spots is taken as the value for specific contact resistance.

Sheet Resistance

For measuring the sheet resistance of a doped silicon wafer surface, the device "GP4-Test Pro" equipped with software package "GP-4 Test 1.6.6 Pro" from the company GP solar GmbH is used. For the measurement, the 4 point measuring principle is applied. The two outer probes apply a constant current and two inner probes measure the voltage. The sheet resistance is deduced using the Ohmic law in Ohm/square. To determine the average sheet resistance, the measurement is performed on 25 equally distributed spots of the wafer. In an air conditioned room with a temperature of 22±1° C., all equipment and materials are equilibrated before the measurement. To perform the measurement, the "GP-Test.Pro" is equipped with a 4-point measuring head (part no. 04.01.0018) with sharp tips in order to penetrate the anti-reflection and/or passivation layers. A current of 10 mA is applied. The measuring head is brought into contact with the non metalized wafer material and the measurement is started. After measuring 25 equally distributed spots on the wafer, the average sheet resistance is calculated in Ohm/square.

Efficiency, Fill Factor, and Series Resistance

The sample solar cell is characterized using a commercial IV-tester "cetisPV-CTL1" from Halm Elektronik GmbH. All parts of the measurement equipment as well as the solar cell to be tested were maintained at 25° C. during electrical measurement. This temperature is always measured simultaneously on the cell surface during the actual measurement by a temperature probe. The Xe Arc lamp simulates the sunlight with a known AM1.5 intensity of 1000 W/m$^2$ on the cell surface. To bring the simulator to this intensity, the lamp is flashed several times within a short period of time until it reaches a stable level monitored by the "PVCTControl 4.313.0" software of the IV-tester. The Halm IV tester uses a multi-point contact method to measure current (I) and voltage (V) to determine the cell's IV-curve. To do so, the solar cell is placed between the multi-point contact probes in such a way that the probe fingers are in contact with the bus bars of the cell. The numbers of contact probe lines are adjusted to the number of bus bars on the cell surface. All electrical values were determined directly from this curve automatically by the implemented software package. As a reference standard a calibrated solar cell from ISE Freiburg consisting of the same area dimensions, same wafer material and processed using the same front side layout is tested and the data compared to the certificated values. At least 5 wafers processed in the very same way are measured and the data interpreted by calculating the average of each value. The software PVCTControl 4.313.0 provides values for efficiency, fill factor, short circuit current, series resistance and open circuit voltage.

Particle Size

A typically method to determine $d_{10}$, $d_{90}$ and $d_{50}$ is for example described in DIN EN 725-5.

Glass Transition Temperature ($T_g$)

$T_g$ is determined by Differential Scanning calorimetry DSC (measuring heat capacity).

Dopant Level

Dopant levels are measured using secondary ion mass spectroscopy.

Temperature Profile in the Firing Furnace

The temperature profile for the firing process was measured with a Datapaq DQ 1860 A data-logger from Datapaq Ltd., Cambridge, UK connected to a Wafer Test Assembly 1-T/C 156 mm SQ from Despatch (part no. DES-300038). The data logger is protected by a shielding box TB7250 from Datapaq Ltd., Cambridge, UK and connected to the thermocouple wires of the Wafer Test Assembly. The solar cell simulator was placed onto the belt of the firing furnace directly behind the last wafer so that the measured temperature profile of the firing process was measured accurately. The shielded data logger followed the Wafer Test assembly at a distance of about 50 cm to not affect the temperature profile stability. The data was recorded by data logger and subsequently analysed using a computer with Datapaq Insight Reflow Tracker V7.05 software from Datapaq Ltd., Cambridge, UK.

EXAMPLES

The present invention is now explained by means of examples which are intended for illustration only and are not to be considered as limiting the scope of the present invention.

Example 1

A paste was made by mixing, by means of a Kenwood Major Titanium mixer, the appropriate amounts of organic vehicle (Table 1), Ag powder (PV 4 from Ames Inc. with a $d_{50}$ of 2 µm), glass frit ground to $d_{50}$ of 1.5 µm, organic metal oxide, a metal oxide, an organic metal compound or a silver metal oxide according to the specific example. The paste was passed through a 3-roll mill Exact 80 E with stainless steel rolls with a first gap of 120 μm and a second gap of 60 μm with progressively decreasing gaps to 20 μm for the first gap and 10 μm for the second gap several times until homogeneity. The viscosity was measured as mentioned above and appropriate amounts of organic vehicle with the composition given in Table 1 were added to adjust the paste viscosity toward a target in a range from about 16 to about 20 Pas. The wt. % s of the constituents of the paste are given in Table 2.

TABLE 1

Constituents of organic vehicle

| Organic Vehicle Component | Proportion of component |
|---|---|
| 2-(2-butoxyethoxy)ethanol) [solvent] | 84 |
| ethyl cellulose (DOW Ethocel 4) [binder] | 6 |
| Thixcin ® E [thixotropic agent] | 10 |

TABLE 2

Constituents of the paste

| Example | Ag powder (wt. %) | Glass frit (wt. %) | Metal oxide (wt. %) | Organic metal oxide (wt. %) | Silver metal oxide | Organic metal compound | Organic vehicle (wt. %) |
|---|---|---|---|---|---|---|---|
| 1 (inventive) | 86 | 3.5 | — | 0.5 wt. % - $MoO_2(acac)_2$ | — | — | 10 |
| 2 (inventive) | 86 | 3.5 | — | 0.5 wt. % - $WO_2(acac)_2$ | — | — | 10 |
| 3 (inventive) | 86 | 3.5 | — | 0.5 wt. % - $VO(acac)_2$ | — | — | 10 |
| 4 (inventive) | 86 | 3.5 | 0.5 wt. % - $MoO_3$ | — | — | — | 10 |
| 5 (inventive) | 86 | 3.5 | 0.5 wt. % - $WO_3$ | — | — | — | 10 |
| 6 (inventive) | 86 | 3.5 | 0.5 wt. % - $GeO_2$ | — | — | — | 10 |
| 7 (inventive) | 86 | 3.5 | 0.5 wt. % - $As_2O_5$ | — | — | — | 10 |
| 8 (inventive) | 86 | 3.5 | 0.5 wt. % - $Sb_2O_3$ | — | — | — | 10 |
| 9 (inventive) | 86 | 3.5 | 0.5 wt. % - $NbO$ | — | — | — | 10 |
| 10 (inventive) | 86 | 3.5 | 0.5 wt. % - $Ta_2O_5$ | — | — | — | 10 |
| 11 (inventive) | 86 | 3.5 | — | — | 0.5 wt. % - $Ag_2MoO_4$ | — | 10 |
| 12 (inventive) | 86 | 3.5 | — | — | 0.5 wt. % - $Ag_2WO_4$ | — | 10 |
| 13 (inventive) | 86 | 3.5 | — | — | 0.5 wt. % - $Ag_2GeO_4$ | — | 10 |
| 14 (inventive) | 86 | 3.5 | — | — | 0.5 wt. % - $Ag_5Pb_2O_6$ | — | 10 |
| 15 (inventive) | 86 | 3.5 | — | — | 0.5 wt. % - $Ag_3AsO_4$ | — | 10 |
| 16 (inventive) | 86 | 3.5 | — | — | 0.5 wt. % - $AgSbO_s$ | — | 10 |
| 17 (inventive) | 86 | 3.5 | — | — | 0.5 wt. % - $Ag_2TeO_3$ | — | 10 |
| 18 (inventive) | 86 | 3.5 | — | — | 0.5 wt. % - $AgTaO_3$ | — | 10 |
| 19 (inventive) | 86 | 3.5 | — | — | 0.5 wt. % - $AgNbO_3$ | — | 10 |
| 20 (inventive) | 86 | 3.5 | — | — | 0.5 wt. % - $Ag_3VO_4$ | — | 10 |
| 21 (inventive) | 86 | 3.5 | — | — | 0.5 wt. % - $AgCrO_2$ | — | 10 |
| 22 (inventive) | 86 | 3.5 | — | — | — | 0.5 wt. % - $Mo(acac)_3$ | 10 |
| 23 (inventive) | 86 | 3.5 | — | — | — | 0.5 wt. % - $V(acac)_3$ | 10 |
| 24 (inventive) | 86 | 3.5 | — | — | — | 0.5 wt. % - $Pb(acac)_4$ | 10 |
| 25 (inventive) | 86 | 3.5 | — | — | — | 0.5 wt. % - $Cr(acac)_3$ | 10 |
| 26 (inventive) | 86 | 3.5 | — | — | $Ag_2SeO_4$ | — | 10 |
| 27 (comparative) | 86 | 3.5 | — | — | — | — | 10.5 |

Solar Cell Preparation and Measurements

Pastes were each applied to the front face of an n-type cell and to the front face of a p-type cell, and to one or both of n-type doped and p-type doped faces of an interdigitated back contact cell. The n-type cell had a full square mono-crystalline wafer with a n-type base doping and a base resistivity in the range from 0.1 to 10 Ohm*cm and with p-type doped emitter surface with a sheet resistance of 60 Ohm/square and with an opposite n-type doped surface of 40 Ohm/square. The p-type cell had a full square mono-crystalline wafer with a p-type base doping and a base resistivity in the range from 0.1 to 10 Ohm*cm and with n-type doped emitter surface with a sheet resistance of 60 Ohm/square. The interdigitated cell had both n-type and p-type faces on the same side, both with a sheet resistance of 60 Ohm/square. The wafer dimensions were 156×156 mm$^2$.

a) N-type cell: Both faces were also coated with a 70 nm thick PECVD (plasma enhanced chemical vapour deposition) $SiN_x$ passivation and anti-reflective layer, commercially available from Fraunhofer ISE. The example paste was screen-printed onto the front face of the n-type wafer using an ASYS Automatisierungssysteme GmbH Ekra E2 screen printer and a standard H-pattern screen from Koenen GmbH and the paste of comparative paste 27 was printed on the back face. The screen for the front side had 75 finger lines with 50 µm openings and three 1.5 mm wide busbars. The screen for the back side had 90 finger lines with 60 µm openings and three 1.5 mm wide busbars. The Emulsion over mesh was in the range from 11 to 15 µm, the screen had 350 mesh and 16 µm stainless steel wire. The printing parameters were 1.0 bar squeegee pressure, forward squeegee speed 200 mm/s and flooding speed 200 mm/s. The device with the printed patterns on both sides was then dried in an oven for 10 minutes at 150° C. The substrates were then fired sun-side up with a Centrotherm Cell & Module GmbH c-fire fast firing furnace. The furnace consists of 6 zones. Zone 1 was set to 350° C., zone 2 to 475° C., zone 3 to 470° C., zone 4 to 540° C., zone 5 to 840° C. and zone 6 to 880° C. The belt speed was set to 5100 mm/min.

b) P-type cell: The example paste was screen-printed onto the n-type doped face of the wafer using an ASYS Automatisierungssysteme GmbH Ekra E2 screen printer and a standard H-pattern screen from Koenen GmbH. The screen had 76 finger lines with 50 µm openings and three 1.5 mm wide busbars. The Emulsion over mesh was in the range from 16 to 20 µm, the screen had 300 mesh and 20 µm stainless steel wire. The printing parameters were 1.2 bar squeegee pressure, forward squeegee speed 150 mm/s and flooding speed 200 mm/s. A commercially available Al paste, Gigasolar 136 from Giga Solar Materials Corp., was printed on the non-illuminated (back) face of the device. The device with the printed patterns on both sides was then dried in an oven for 10 minutes at 150° C. The substrates were then fired sun-side up with a Centrotherm Cell & Module GmbH c-fire fast firing furnace. The furnace consists of 6 zones. Zone 1 was set to 350° C., zone 2 to 475° C., zone 3 to 470° C., zone 4 to 540° C., zone 5 to 840° C. and zone 6 to 880° C. The belt speed was set to 5100 mm/min.

c) IBC cell: For each example paste, the following combinations were printed on the n-type and p-type faces of the non-illuminated (back) face of the interdigitated back contacted cell: i) example paste on p-type face, comparative paste 27 on n-type face; ii) example paste on n-type face, comparative paste 27 on p-type face; iii) example paste on both n-type and p-type faces. Printing was carried out using an ASYS Automatisierungssysteme GmbH Ekra E2 screen printer and a screen from Koenen GmbH The screen had 45 finger lines with 60 µm openings and one 1.5 mm wide busbars at one end of the finger lines. The device with the printed patterns on both n-type and p-type faces was then dried in an oven for 10 minutes at 150° C. The substrates were then fired with a Centrotherm Cell & Module GmbH c-fire fast firing furnace. The furnace consists of 6 zones. Zone 1 was set to 350° C., zone 2 to 475° C., zone 3 to 470° C., zone 4 to 540° C., zone 5 to 840° C. and zone 6 to 880° C. The belt speed was set to 5100 mm/min.

The fully processed samples were then tested for cell efficiency using the above mentioned method. The results for the convention n-type and p-type cells are shown in Table 3. Results for the interdigitated cell are shown in table 4. For each paste, the results of the mean cell efficiency for 3 samples are shown.

TABLE 3

| Example | Metal compound | Front face surface doping | Cell efficiency |
|---|---|---|---|
| 1a (inventive) | $MoO_2(acac)_2$ | p-type | ++ |
| 1b (comparative) | $MoO_2(acac)_2$ | n-type | + |
| 2a (inventive) | $WO_2(acac)_2$ | p-type | ++ |
| 2b (comparative) | $WO_2(acac)_2$ | n-type | + |
| 3a (inventive) | $VO(acac)_2$ | p-type | ++ |
| 3b (comparative) | $VO(acac)_2$ | n-type | + |
| 4a (inventive) | $MoO_3$ | p-type | ++ |
| 4b (comparative) | $MoO_3$ | n-type | + |
| 5a (inventive) | $WO_3$ | p-type | ++ |
| 5b (comparative) | $WO_3$ | n-type | + |
| 11a (inventive) | $Ag_2MoO_4$ | p-type | ++ |
| 11b (comparative) | $Ag_2MoO_4$ | n-type | + |
| 12a (inventive) | $Ag_2WO_4$ | p-type | ++ |
| 12b (comparative) | $Ag_2WO_4$ | n-type | + |
| 27a (comparative) | None | p-type | −− |
| 27b (comparative) | None | n-type | − |

− = poor,
+ = good,
++ = very good

TABLE 4

Examples for IBC cell performance

| Example | Metal compound p-type face | Metal compound n-type face | Cell efficiency |
|---|---|---|---|
| 1 i | $MoO_2(acac)_2$ | None | + |
| 1 ii | None | $MoO_2(acac)_2$ | − |
| 1 iii | $MoO_2(acac)_2$ | $MoO_2(acac)_2$ | ++ |
| 2 i | $WO_2(acac)_2$ | None | + |
| 2 ii | None | $WO_2(acac)_2$ | − |
| 2 iii | $WO_2(acac)_2$ | $WO_2(acac)_2$ | ++ |
| 3 i | $VO(acac)_2$ | None | + |
| 3 ii | None | $VO(acac)_2$ | − |
| 3 iii | $VO(acac)_2$ | $VO(acac)_2$ | ++ |
| 4 i | $MoO_3$ | None | + |
| 4 ii | None | $MoO_3$ | − |
| 4 iii | $MoO_3$ | $MoO_3$ | ++ |
| 5 i | $WO_3$ | None | + |
| 5 ii | None | $WO_3$ | − |
| 5 iii | $WO_3$ | $WO_3$ | ++ |
| 11 i | $Ag_2MoO_4$ | None | + |
| 11 ii | None | $Ag_2MoO_4$ | − |
| 11 iii | $Ag_2MoO_4$ | $Ag_2MoO_4$ | ++ |
| 12 i | $Ag_2WO_4$ | None | + |
| 12 ii | None | $Ag_2WO_4$ | − |

TABLE 4-continued

Examples for IBC cell performance

| Example | Metal compound p-type face | Metal compound n-type face | Cell efficiency |
|---|---|---|---|
| 12 iii | $Ag_2WO_4$ | $Ag_2WO_4$ | ++ |
| 27 (comparative) | None | None | -- |

− = poor,
+ = good,
++ = very good

REFERENCE LIST 101 doped Si wafer
102 p-n junction boundary
103 Front electrode
104 Back electrode
105 Front doped layer
106 Back doped layer
207 Front passivation layer
208 Back passivation layer
209 Anti-reflection layer
210 Highly doped back layer
311 Additional layers on back face
312 Additional layers on front face
313 Electro-conductive paste
214 Front electrode fingers
215 Front electrode bus bars
420 Wafer
421 Cuts
422 Finger lines
601 front anti-reflection coating
602 Front passivation layer
603 Front highly doped n-type layer
604 n-type doped bulk
605 Back passivation layer
606 Back anti-reflection coating
607 Back highly doped n-type faces
608 Back highly doped p-type faces
609 Electrodes
701 Si wafer
702 Electrodes contacting p-type doped faces
703 Current collector for p-type connection
704 Electrodes contacting n-type doped faces
705 Current collector for n-type connection

The invention claimed is:

1. A precursor comprising the following precursor constituents:
   a. a Si wafer with at least one p-type doped face and at least one n-type doped face;
   b. a conductive paste comprising the following paste constituents:
      i. at least about 70 wt. % Ag particles, based on the paste,
      ii. a vehicle,
      iii. a glass, and
      iv. a metal compound comprising a metal M and which is one or more selected from the group consisting of: an organic metal oxide, a metal oxide, an organic metal compound and a silver metal oxide;
   wherein the conductive paste is superimposed on a p-type doped face.

2. The precursor according to claim 1, wherein the metal M of the metal compound is one or more selected from the group consisting of: Ge, Pb, As, Se, Sb, Bi, Te, Nb, Ta, Cr, Mo, W and V.

3. The precursor according to claim 1, wherein the metal compound comprises a chelating organic ligand.

4. The precursor according to claim 3, wherein the metal compound comprises one or more acetylacetonoate (acac) ligands.

5. The precursor according to claim 1, wherein the metal compound is an organic metal oxide.

6. The precursor according to claim 1, wherein the metal compound has the general formula $M_xO_yL_z$, wherein
   M is a metal;
   L is a chelating ligand, and wherein the L may be the same as or different to each other;
   x an integer in the range from about 1 to about 4;
   y is an integer in the range from about 1 to about 8;
   z is an integer in the range from about 1 to about 20.

7. The precursor according to claim 1, wherein the metal compound is one or more selected from the group consisting of: $VO(acac)_2$, $V(acac)_3$, $MoO_2(acac)_2$, $WO_2(acac)_2$, and $Mo_2O_3(acac)_4$.

8. The precursor according to claim 1, wherein at least 50 vol. % of the wafer is n-type doped.

9. The precursor according to claim 1, wherein at least one of the following criteria are satisfied:
   a. the viscosity of the paste is in the range from about 5 to about 35 Pa*s;
   b. all solvents present in the paste have a boiling point in a range from about 90 to about 300° C.

10. The precursor according to claim 1, wherein the Ag particles have a value of $d_{50}$ for diameter distribution in the range from about 0.1 to about 5 µm.

11. The precursor according to claim 1, wherein the Ag particles are spherical.

12. A process for producing a solar cell comprising the following steps:
   a. providing a precursor according to claim 1;
   b. firing the precursor in order to obtain the solar cell.

13. A module comprising at least 2 solar cells, at least one of which is according to claim 12.

14. A solar cell obtained by a process according to claim 12.

15. The process according to claim 14, wherein the firing in step b. satisfies at least one of the following criteria:
   a. holding temperature in a range from about 700 to about 900° C.;
   b. time at the holding temperature in a range from about 1 to about 10 s.

16. The process according to claim 14, wherein the paste is applied to the wafer through a screen.

17. The process according to claim 16, wherein the application through a screen satisfies at least one of the following parameters:
   a. mesh count in a range from about 290 to about 400/inch;
   b. wire thickness in a range from about 10 to about 30 µm;
   c. Emulsion over mesh (EoM) thickness in a range from about 5 to about 25 µm;
   d. finger spacing in a range from about 1 to about 3 mm.

* * * * *